US008900371B2

(12) United States Patent
Mizuta et al.

(10) Patent No.: US 8,900,371 B2
(45) Date of Patent: Dec. 2, 2014

(54) CLEANING AGENT FOR SUBSTRATE AND CLEANING METHOD

(75) Inventors: Hironori Mizuta, Saitama (JP); Masahiko Kakizawa, Saitama (JP); Ichiro Hayashida, Saitama (JP)

(73) Assignee: Wako Pure Chemical Industries, Ltd., Osaka-shi (JP)

( * ) Notice: Subject to any disclaimer, the term of this patent is extended or adjusted under 35 U.S.C. 154(b) by 0 days.

(21) Appl. No.: 13/232,369

(22) Filed: Sep. 14, 2011

(65) Prior Publication Data

US 2012/0000485 A1 Jan. 5, 2012

Related U.S. Application Data

(62) Division of application No. 10/577,129, filed as application No. PCT/JP2004/015040 on Oct. 13, 2004, now abandoned.

(30) Foreign Application Priority Data

Oct. 27, 2003 (JP) .................................. 2003-365588

(51) Int. Cl.
| | | |
|---|---|---|
| *B08B 3/04* | (2006.01) | |
| *C11D 7/36* | (2006.01) | |
| *C11D 7/50* | (2006.01) | |
| *C11D 7/32* | (2006.01) | |
| *C11D 7/26* | (2006.01) | |
| *C23G 5/02* | (2006.01) | |
| *C23G 5/032* | (2006.01) | |
| *C11D 11/00* | (2006.01) | |
| *H01L 21/02* | (2006.01) | |

(52) U.S. Cl.
CPC ........ *H01L 21/02052* (2013.01); *C11D 7/3245* (2013.01); *C11D 7/263* (2013.01); *C23G 5/02* (2013.01); *C11D 7/262* (2013.01); *C23G 5/032* (2013.01); *C11D 7/264* (2013.01); *C11D 7/261* (2013.01); *C11D 11/0047* (2013.01); *C11D 7/36* (2013.01)
USPC ............. 134/1.2; 134/1.3; 510/175; 510/176; 510/245; 510/254; 510/258; 510/477; 510/488; 510/505; 510/506

(58) Field of Classification Search
CPC .... C11D 3/2003; C11D 3/2006; C11D 3/201; C11D 3/2041; C11D 3/2072; C11D 3/2079; C11D 3/2082; C11D 3/26; C11D 3/364; C11D 3/365; B08B 3/02; B08B 3/024; B08B 3/04; B08B 3/041; B08B 3/044; B08B 3/08; H01L 21/02057; H01L 21/0206
USPC ......... 510/175, 176, 245, 254, 258, 477, 488, 510/505, 506; 134/1.2, 1.3
See application file for complete search history.

(56) References Cited

U.S. PATENT DOCUMENTS

| | | | |
|---|---|---|---|
| 5,998,358 A | 12/1999 | Herdt et al. | |
| 6,121,219 A | 9/2000 | Herdt et al. | |
| 6,309,470 B1 | 10/2001 | Schulhoff et al. | |
| 6,346,217 B1 | 2/2002 | Schaal | |
| 6,395,693 B1 | 5/2002 | Wang | |
| 6,465,403 B1 | 10/2002 | Skee | |
| 6,541,434 B2 | 4/2003 | Wang | |
| 6,562,726 B1* | 5/2003 | Torek et al. ................... | 438/745 |
| 6,585,825 B1 | 7/2003 | Skee | |
| 6,599,370 B2 | 7/2003 | Skee | |
| 6,828,289 B2* | 12/2004 | Peters et al. .................. | 510/175 |
| 7,183,246 B2 | 2/2007 | Schulhoff et al. | |
| 7,208,049 B2* | 4/2007 | Zhang et al. ...................... | 134/3 |
| 7,235,188 B2* | 6/2007 | Daviot et al. ................ | 252/79.1 |
| 7,547,671 B2 | 6/2009 | Kaneko et al. | |
| 2001/0018407 A1 | 8/2001 | Kakizawa et al. | |
| 2001/0050350 A1 | 12/2001 | Wojtczak et al. | |
| 2002/0077259 A1 | 6/2002 | Skee | |

(Continued)

FOREIGN PATENT DOCUMENTS

| | | |
|---|---|---|
| CA | 2176336 A1 | 5/1995 |
| EP | 0643154 A2 | 3/1995 |

(Continued)

OTHER PUBLICATIONS

International Search Report of PCT/JP2004/015040, dated Jan. 20, 2005.
European Office Action dated Jan. 27, 2011, issued in corresponding European Patent Application No. 04792284.4.
Japanese Office Action dated Jan. 10, 2012, issued in corresponding Japanese Patent Application No. 2005-514927.
Japanese Office Action dated Sep. 28, 2010, issued in corresponding Japanese Patent Application No. 2005-514927.

*Primary Examiner* — Gregory R Delcotto
(74) *Attorney, Agent, or Firm* — Westerman, Hattori, Daniels & Adrian, LLP

(57) ABSTRACT

The present invention provides a cleaning agent for a substrate and a cleaning method thereof, which can effectively remove fine particles (particles) present on a surface of substrate or impurities derived from various kinds of metals (metallic impurities), without causing roughness surface of a substrate, in particular, a semiconductor substrate, and without causing corrosion or oxidation of metal wirings, in particular, copper wirings, provided on a surface of substrate, and can further remove at the same time a carbon defect present on a surface of substrate, without removing a metal corrosion inhibitor—Cu film, in particular, a Cu-BTA film.
The present invention provides a cleaning agent for a substrate comprising [I] an organic acid having at least one carboxyl group and/or [II] a complexing agent, and [III] an organic solvent selected from the group consisting of (1) monohydric alcohols, (2) alkoxyalcohols, (3) glycols, (4) glycol ethers, (5) ketones and (6) nitriles, and a cleaning method for a surface of substrate, which comprises the surface of substrate is treated with said cleaning agent.

7 Claims, No Drawings

(56) References Cited

U.S. PATENT DOCUMENTS

| | | |
|---|---|---|
| 2002/0094941 A1 | 7/2002 | Schulhoff et al. |
| 2002/0169088 A1 | 11/2002 | Wang |
| 2002/0177316 A1* | 11/2002 | Miller et al. .................. 438/689 |
| 2003/0083214 A1 | 5/2003 | Kakizawa et al. |
| 2003/0158059 A1* | 8/2003 | Sakai et al. ................... 510/175 |
| 2003/0164471 A1* | 9/2003 | Small et al. ................... 252/79.1 |
| 2003/0181344 A1 | 9/2003 | Ikemoto et al. |
| 2003/0199406 A1 | 10/2003 | Anzures et al. |
| 2004/0106531 A1 | 6/2004 | Kanno et al. |
| 2004/0116313 A1 | 6/2004 | Nosowitz et al. |
| 2005/0148481 A1 | 7/2005 | Kaneko et al. |

FOREIGN PATENT DOCUMENTS

| | | | |
|---|---|---|---|
| EP | 0812011 | A2 | 12/1997 |
| EP | 0939344 | A1 | 9/1999 |
| EP | 1047121 | A1 | 10/2000 |
| EP | 1548095 | A1 | 6/2005 |
| JP | 4-130100 | A | 5/1992 |
| JP | 7-79061 | A | 3/1995 |
| JP | 10-026832 | A | 1/1998 |
| JP | 10-72594 | A | 3/1998 |
| JP | 11-316464 | A | 11/1999 |
| JP | 2002-020787 | A | 1/2002 |
| JP | 2003-013266 | A | 1/2003 |
| JP | 2003-510840 | A | 3/2003 |
| JP | 2003-289060 | A | 10/2003 |
| JP | 2004-152925 | A | 5/2004 |
| WO | 95-13350 | A1 | 5/1995 |
| WO | WO98/45399 | * | 3/1998 |
| WO | 98-45399 | A1 | 10/1998 |
| WO | 00-56853 | A1 | 9/2000 |
| WO | 00-72684 | A2 | 12/2000 |
| WO | 01-24242 | A1 | 4/2001 |
| WO | 02-33033 | A1 | 4/2002 |
| WO | WO2004/031333 | * | 4/2004 |

* cited by examiner

CLEANING AGENT FOR SUBSTRATE AND CLEANING METHOD

CROSS-REFERENCE TO RELATED APPLICATION

This application is a divisional application of U.S. application Ser. No. 10/577,129 filed on Jan. 5, 2007, now abandoned which is a National Stage Application of PCT/JP2004/015040 filed Oct. 13, 2004, which is hereby incorporated by reference in its entirety, and which claims priority to Japanese application JP 2003-365588, filed on Oct. 27, 2003.

TECHNICAL FIELD

The present invention relates to a cleaning agent for a surface of substrate, in particular, for a surface of semiconductor substrate provided with copper wiring thereon, and to a cleaning method thereof.

BACKGROUND ART

Recently, with the spread of multilayer wirings on a surface of semiconductor substrate, a so-called chemical mechanical polishing (CMP) technique, by which a semiconductor substrate is mechanically polished and planarized, has been used in producing devices.

In particular, accompanied to the tendency to a highly integrated LSI in recent years, a wiring used has been changed from conventional aluminum to copper (Cu) which has a lower electric resistance, and thus the CMP technique (Cu-CMP) has become essential, when semiconductors having a multilayer structure, in which copper wirings are provided in many layers on the surface thereof, are produced.

The CMP is a method for planarizing a surface of semiconductor substrate using a slurry containing abrasive grains such as silica, aluminum and ceria, and an object to be polished is silicon oxide films, wirings, plugs, or the like.

And the semiconductor surface after the CMP process is contaminated with a large amount of abrasive grain itself used, metals contained in the slurry, or metallic impurities derived from metallic wirings or metallic plug polished, and further various kinds of particles.

Contamination of the surface of semiconductor substrate with the metallic impurities or the particles affects electric characteristics of the semiconductor, and causes to lose reliability of devices. Further, since device is destructed when metallic contamination is significant, it is necessary to introduce a post-CMP cleaning process to remove metallic impurities or particles from the surface of semiconductor substrate.

Heretofore, various kinds of cleaning agents have been developed for use in various types of cleaning processes such as a cleaning process following the CMP process, and provided for use.

On the other hand, since metallic copper on a surface of semiconductor is highly active, and easily corroded by a slight oxidizing power, it tends to cause an increase of wiring resistance or wire breaking. Therefore, it is known that corrosion of metallic copper on a surface of semiconductor can be prevented by adding various kinds of metal corrosion inhibitors [for example, an aromatic type compound represented by benzotriazole(BTA)s and imidazoles, a cyclic compound such as mercaptoimidazole and mercaptothiazole, an aliphatic alcohol type compound which has a mercapto group in a molecule and a carbon to which said mercapto group is bonded and a carbon to which a hydroxyl group is bonded links adjacently such as mercaptoethanol and mercaptoglycerol]. In particular, in a slurry used in the above-described Cu-CMP process, an inhibitor for metal corrosion as described above is added to prevent the polished metal surface from corrosion.

The metal corrosion inhibitor is supposed to be adsorbed on a surface of metal (for example, Cu) of semiconductor surface and form a metal corrosion inhibiting film (for example, a metal corrosion inhibitor—Cu film such as a Cu-BTA film), and thus to prevent corrosion of the metal (for example, Cu).

However, these metal corrosion inhibitors may remain on a surface of semiconductor as a so-called carbon defect.

There has been a problem that when a semiconductor having a carbon defect remaining on a surface thereof is subjected to heat treatment in the subsequent process, during working of a device or the like, the carbon defect is burnt to oxidize a wiring material resulting in deterioration of the device performance, or an apprehension that multilayer wiring executed without removing the carbon defect tends to put the flatness of upper layer part into disorder, and make a correct lamination difficult to cause a serious defect in working of the device.

However, a cleaning agent, which is conventionally used in various cleaning processes such as a post-CMP cleaning process, cannot sufficiently remove the carbon defect, or apt to remove a metal corrosion inhibiting film that is needed to prevent corrosion of metal surface as described above. Thus, an effective means has not been found which can remove only the carbon defect while maintaining the metal corrosion inhibiting effect, without removing a metal corrosion inhibitor—Cu film, in particular, a Cu-BTA film as described above.

Patent Reference 1:JP-A-4-130100 (Claims 1 to 3)
Patent Reference 2:
JP-A-7-79061 (Claim 1)
Patent Reference 3:
JP-A-10-72594
Patent Reference 4:JP-A-10-26832 (Claims 1 to 15)
Patent Reference 5:JP-A-11-316464 (Claims 1 to 6)
Patent Reference 6:JP-A-2002-20787 (Claims 1 to 36)
Patent Reference 7:JP-A-2003-13266 (Claims 1 to 42)

DISCLOSURE OF THE INVENTION

Problems to be Solved by the Invention

The present invention has been made under such circumstances as described above, and provides a cleaning agent for a substrate and a cleaning method thereof, which can effectively remove fine particles (particles) present on a surface of substrate or impurities (metallic impurities) derived from various kinds of metals, without causing roughness surface of a substrate, in particular, a semiconductor substrate, and without causing corrosion or oxidation of metal wirings, in particular, copper wirings, provided on a surface of substrate, and further can remove at the same time the carbon defect present on a surface of substrate, without removing a metal corrosion inhibitor—Cu film, in particular, a Cu-BTA film.

Means to Solve the Problems

The present invention consists of the following items:
(1) a cleaning agent for a substrate comprising [I] an organic acid having at least one carboxyl group and/or [II] a complexing agent, and [III] an organic solvent selected from the group consisting of (1) monohydric alcohols, (2) alkoxyalcohols, (3) glycols, (4) glycol ethers, (5) ketones and (6) nitriles; and (2) a cleaning method for a substrate surface, which comprises treating the substrate surface with said cleaning agent according to the above item (1).

Namely, the present inventors have, after intensively studying a way to achieve the above-described object, found that not only particles and metallic impurities on a surface of substrate can be removed without causing roughness surface of a semiconductor substrate or corrosion or oxidation of metal wirings, in particular, cupper wirings provided on a semiconductor substrate, but also a carbon defect remaining on a substrate surface can also be easily removed at the same time without losing a metal corrosion inhibitor—Cu film, in particular, a Cu-BTA film, by cleaning the substrate surface using a cleaning agent for substrate comprising [I] an organic acid having at least one carboxyl group and for [II] a complexing agent and [III] a specified organic solvent, in particular, a cleaning agent for substrate comprising [I] an organic acid having at least one carboxyl group, [II] a complexing agent and [III] a specified organic solvent, and further that specified solvents, among organic solvents, are superior in exhibiting such an effect, and a combined use of the specified organic solvents and a compound having at least one phosphonic acid group in a molecule (a phosphonic acid type complexing agent) as a complexing agent is particularly preferable, and accomplished the present invention.

The reason why the above-described object can be achieved by the present invention is not sure, but is supposed as follows. For instance, a carbon defect becomes unstable in the optimum pH range generated by an organic acid and is hence dissolved in an organic solvent. On the other hand, a metal corrosion inhibiting film (for example, a metal corrosion inhibitor—Cu film such as a Cu-BTA film) is not dissolved in an organic solvent or water in the above pH range, and thus a dissolution selection ratio of the carbon defect and the metal corrosion inhibiting film (for example, a Cu-BTA film) is increased, and only the carbon defect can be removed without removing the metal corrosion inhibiting film (in particular, a Cu-BTA film) while the metal corrosion inhibiting effect is maintained.

The organic solvent according to the present invention is water-soluble, but all of water-soluble organic solvents cannot necessarily be used. Those which can satisfy the object of the present invention include, for example, monohydric alcohols such as saturated aliphatic monohydric alcohols having 1 to 10 carbon atoms, preferably 1 to 8 carbon atoms, and more preferably 1 to 5 carbon atoms, unsaturated aliphatic monohydric alcohols having 2 to 12 carbon atoms, preferably 2 to 10 carbon atoms, and more preferably 2 to 6 carbon atoms; alkoxyalcohols having 3 to 20 carbon atoms, preferably 3 to 16 carbon atoms, and more preferably 3 to 10 carbon atoms; glycols having 2 to 40 carbon atoms, preferably 2 to 20 carbon atoms, and more preferably 2 to 16 carbon atoms; glycol ethers having 3 to 40 carbon atoms, preferably 3 to 30 carbon atoms, and more preferably 3 to 20 carbon atoms; ketones having 3 to 40 carbon atoms, preferably 3 to 30 carbon atoms, and more preferably 3 to 10 carbon atoms; nitriles such as simple nitriles having 2 to 10 carbon atoms, preferably 2 to 8 carbon atoms, and more preferably 2 to 4 carbon atoms, α-aminonitriles having 4 to 20 carbon atoms, preferably 4 to 15 carbon atoms, and more preferably 4 to 10 carbon atoms, α-hydroxynitriles having 4 to 20 carbon atoms, preferably 4 to 15 carbon atoms, and more preferably 4 to 10 carbon atoms, β-aminonitriles having 4 to 20 carbon atoms, preferably 4 to 15 carbon atoms, and more preferably 4 to 10 carbon atoms, dinitriles having 4 to 20 carbon atoms, preferably 4 to 15 carbon atoms, and more preferably 4 to 10 carbon atoms, a-unsaturated nitriles having 5 to 30 carbon atoms, preferably 5 to 20 carbon atoms, and more preferably 5 to 18 carbon atoms, α-benzene nitriles having 8 to 30 carbon atoms, preferably 8 to 20 carbon atoms, and more preferably 8 to 15 carbon atoms, and heterocyclic nitriles having 5 to 30 carbon atoms, preferably 5 to 20 carbon atoms, and more preferably 5 to 15 carbon atoms.

Specific examples are as follows. Monohydric alcohols include, for example, saturated aliphatic monohydric alcohols such as methanol, ethanol, n-propylalcohol, isopropylalcohol, 1-butanol, 2-butanol, isobutylalcohol, tert-butylalcohol, 1-pentanol, 2-pentanol, 3-pentanol, 2-methyl-1-butanol, isopentylalcohol, sec-butylalcohol, tert-pentylalcohol, 3-methyl-2-butanol, neopentylalcohol, 1-hexanol, 2-methyl-1-pentanol, 4-methyl-2-pentanol, 2-ethyl-1-butanol, 1-heptanol, 2-heptanol, 3-heptanol, 1-octanol, 2-octanol, 2-ethyl-1-hexanol, 1-nonanol, 3,5,5-trimethyl-1-hexanol, 1-decanol, 1-undecanol, 1-dodecanol, cyclohexanol, 1-methylcyclohexanol, 2-methylcyclohexanol, 3-methylcyclohexanol, 4-methylcyclohexanol, 2-ethylhexyl alcohol, capryl alcohol, nonyl alcohol, decyl alcohol, undecyl alcohol, lauryl alcohol, tridecyl alcohol, myristyl alcohol, pentadecyl alcohol, cetyl alcohol, isocetyl alcohol, hexadecyl alcohol, heptadecyl alcohol, stearyl alcohol, oleyl alcohol, octyldodecyl alcohol, nonadecyl alcohol, eicosyl alcohol, ceryl alcohol, melissyl alcohol, α-terpineol, abietinol and fusel oil; unsaturated aliphatic monohydric alcohols such as allyl alcohol, propargyl alcohol, benzyl alcohol, methallyl alcohol, 2- or 3-butenyl alcohol, 2-pentenyl alcohol, furfuryl alcohol and tetrahydrofurfuryl alcohol.

Alkoxyalcohols include, for example, 2-methoxyethanol, 2-ethoxyethanol, 2-(2-methoxy)ethoxyethanol, 2-(2-butoxyethoxy)ethanol, 2-butoxyethanol, 2-propoxyethanol, 3-methoxy-3-methyl-1-butanol, 2-(methoxymethoxy)ethanol, 2-isopropoxyethanol, 2-butoxyethanol and 2-isopentyloxyethanol. Glycols include, for example, ethylene glycol, propylene glycol, butylene glycol, hexylene glycol, diethylene glycol, dipropylene glycol, trimethylene glycol, triethylene glycol, tetraethylene glycol, polyethylene glycol and polypropylene.

Glycol ethers include, for example, ethylene glycol monomethyl ether, ethylene glycol monoethyl ether, ethylene glycol mono n-propyl ether, ethylene glycol mono n-butyl ether, ethylene glycol dimethyl ether, ethylene glycol diethyl ether, diethylene glycol monomethyl ether, diethylene glycol monoethyl ether, diethylene glycol monobutylether, diethylene glycol monohexyl ether, diethylene glycol dimethyl ether, diethylene glycol diethyl ether, triethylene glycol monomethyl ether, triethylene glycol monoethyl ether, 1-methoxy-2-propanol, 1-ethoxy-2-propanol, propylene glycol monoethyl ether, dipropylene glycol monomethyl ether, dipropylene glycol monoethyl ether, tripropylene glycol monomethyl ether, polyethylene glycol monomethyl ether and 3-methoxy-3-methyl-1-butanol.

Ketones include, for example, acetone, methyl ethyl ketone, 2-pentanone, 3-pentanone, 2-hexanone, cyclohexanone, methyl isobutyl ketone, 2-heptanone, 4-heptanone, diisobutyl ketone, acetyl acetone, mesityloxide, phorone, isophorone, cyclohexanone, methylcyclohexanone, acetophenone, camphor, cyclopentanone and hexafluoroacetylacetone.

Nitriles include, for example, simple nitriles such as acetonitrile, propionitrile, n-butyronitrile and isobutyronitrile; α-aminonitriles such as α-aminopropionitrile, α-aminomethylthiobutyronitrile, α-aminobutyronitrile and aminoacetonitrile; α-hydroxylnitriles such as lactonitrile, hydroxyacetonitrile and α-hydroxy-γ-methylthiobutyronitrile; β-aminonitriles such as amino-3-propionitrile; dinitriles such as malononitrile, succinonitrile and adiponitrile; α-unsaturated nitriles such as acrylonitrile and methacrylonitrile; α-benzenenitriles such as homoveratrinitrile and benzonitrile; heterocyclic nitriles such as nicotinonitrile and isonicotinonitrile.

Among these, saturated aliphatic monohydric alcohols, alkoxyalcohols, glycols, glycol ethers, and simple nitriles are preferable, and further, methanol, ethanol, isopropyl alcohol, 2-methoxyethanol, 2-(2-butoxyethoxy)ethanol, ethylene glycol, diethylene glycol monomethyl ether, acetone and acetonitrile are more preferable, because these compounds have a superior ability for removing the carbon defect.

The organic solvent according to the present invention may be used alone or in combination of two or more kinds.

The organic solvent according to the present invention is contained to remove a carbon defect which remains on a surface of substrate, in particular, a surface of semiconductor substrate with metal wirings of Cu or the like provided thereon, which has been treated with a slurry containing a metal corrosion inhibitor in a CMP treatment or the like.

The organic solvent according to the present invention can remove a carbon defect without removing a metal corrosion inhibiting film (for example, a metal corrosion inhibitor—Cu film such as a Cu-BTA film) which has been formed on a surface of semiconductor substrate, and also can remove a carbon defect without dissolving, corroding, oxidizing or decomposing apparatus components relating to device production such as semiconductor materials, wiring materials and plug materials.

The carbon defect is derived from slurry additives added to a slurry, for example, aromatic compounds such as a metal corrosion inhibitor [for example, BTAs and benzimidazoles (JP-A-7-79061 or the like)], in particular, from BTAs such as BTA or BTA derivatives. BTA or BTA derivatives include, for example, benzotriazole, lower alkylbenzotriazoles such as 4- or 5-methylbenzotriazole, 4- or 5-ethylbenzotriazole, 4- or 5-propylbenzotriazole, 4- or 5-isopropylbenzotriazole, 4- or 5-n-butylbenzotriazole, 4- or 5-isobutylbenzotriazole, 4- or 5-pentylbenzotriazole, 4- or 5-hexylbenzotriazole; 5-methoxybenzotriazole, 1-hydroxybenzotriazole, 5-hydroxybenzotriazole, dihydroxypropylbenzotriazole, carboxybenzotriazole, 2,3-dicarboxypropylbenzotriazole, 1-[N,N-bis(2-ethylhexyl)aminomethyl]benzotriazole, 1-[maleic acid] benzotriazole, 1-(substitited aminomethyl)-tolyltriazole (Trade Name: IRGAMET 42, from Ciba-Geigy Aktiengesellshaft), [1,2,3-benzotriazole-1-methyl], [1,2,4-triazole-1-methyl], [2-ethylhexyl]amine, bis[(1-benzotriazole)methyl]sulfonic acid, 3-amino-1,2,4-triazole, 4- or 5-chlorobenzotriazole, 4- or 5-nitrobenzotriazole, benzotriazole monoethanolamine salt, benzotriazole diethylamine salt, benzotriazole cyclohexylamine salt, benzotriazole morpholine salt, benzotriazole isopropylamine salt, methylbenzotriazole cyclohexylamine salt, o-tolyltriazole, m-tolylbenzotriazole and p-tolyltriazole.

It is supposed that the carbon defect is formed by these slurry additives (for example, BTAs) which, for example, melt by a pressure or the like in a CMP process then solidify by cooling on a metal corrosion inhibiting film (for example, a Cu-BTA film) formed on a semiconductor substrate with metal wiring such as of Cu and Ag provided thereon.

The complexing agent according to the present invention is not particularly limited so long as it forms a complex with metallic impurities, and includes, for example, a compound having at least one carboxyl group in a molecule, a compound having at least one phosphonic acid group in a molecule, N-substituted amino acids, condensed phosphoric acids, and ammonium salts or alkali metal salts thereof.

The compound having at least one carboxyl group in a molecule is preferably a nitrogen-containing polycarboxylic acid having 1 to 4 nitrogen atoms and 2 to 6 carboxyl groups in a molecule, and specifically includes, for example, alkylimimo polycarboxylic acids which may have a hydroxyl group such as hydroxyethyliminodiacetic acid [HIDA] and iminodiacetic acid [IDA]; nitrilopolycarboxylic acids such as nitrilotriacetic acid [NTA] and nitrilotripropionic acid [NTP]; mono- or polyalkylene polyamine polycarboxylic acids which may have a hydroxyalkyl group, a hydroxyaryl group or a hydroxyaralkyl group such as ethylendiamine tetraacetic acid [EDTA], ethylendiamine diacetic acid [EDDA], ethylendiamine dipropionic acid dihydrochloric acid [EDDP], hydroxyethylethylenediamine triacetic acid [EDTA-OH], 1,6-hexamethylenediamine-N,N,N',N'-tetraacetic acid [HDTA], triethylenetetramine hexaacetic acid [TTHA], diethylenetriamine-N,N,N',N'',N''-pentaacetic acid [DTPA] and N,N-bis(2-hydroxybenzyl)ethylenediamine-N,N-diacetic acid [HEED]; polyaminoalkane polycarboxylic acids such as diaminopropane tetraacetic acid [Methyl-EDTA] and trans-1,2-diaminocyclohexane-N,N,N',N'-tetraacetic acid [CyDTA]; polyaminoalkanol polycarboxylic acids such as diaminopropanol tetraacetic acid [DPTA-OH]; and hydroxyalkylether polyamine polycarboxylic acids such as glycolether diamine tetraacetic acid [GEDTA].

The compound having at least one phosphonic acid group in a molecule includes, for example, a nitorogen-containing polyphosphonic acid having 1 to 6 nitrogen atoms and 1 to 8 phosphonic acid groups in a molecule such as alkylaiminopoly (alkylphosphonic acid), mono- or polyalkylenepolyamine poly(alkylphosphonic acid) and nitrilopoly(alkylphosphonic acid); arylphosphonic acid; alkylenepolyphosphonic acid; and alkanepolyphosphonic acid which may have a hydroxyl group.

The compound having at least one phosphonic acid group is more preferably a compound represented by the following general formula [1], [2] or [4]:

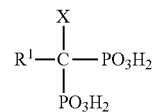

[1]

(wherein, X represents a hydrogen atom or a hydroxyl group, and $R^1$ represents a hydrogen atom or an alkyl group);

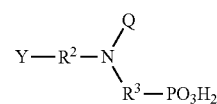

[2]

(wherein, Q represents a hydrogen atom, or —$R^3$—$PO_3H_2$ group, $R^2$ and $R^3$ represent each independently an alkylene group, and Y represents a hydrogen atom, —$R^3$—$PO_3H_2$ group or a group represented by the following general formula [3]):

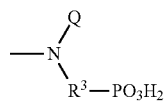

[3]

(wherein, Q and $R^3$ are same to the above);

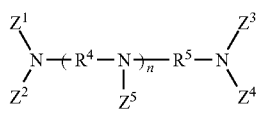

[4]

(wherein, $R^4$ and $R^5$ represent each independently a lower alkylene group, n represents an integer of 1 to 4, $Z^1$ to $Z^4$ and at least 4 of $n \times Z^5$ represent an alkyl group having a phosphonic acid group, and the rest represents an alkyl group.)

In the general formula [1], the alkyl group represented by $R^1$ is preferably a straight chained or a branched one having 1 to 10 carbon atoms, and includes, for example, a methyl group, an ethyl group, a n-propyl group, an isopropyl group, a n-butyl group, an isobutyl group, a tert-butyl group, a sec-butyl group, a n-pentyl group, an isopentyl group, a tert-pentyl group, a 1-methylpentyl group, a n-hexyl group, an isohexyl group, a heptyl group, an octyl group, a nonyl group and a decyl group.

In the general formulae [2] and [3], each of the alkylene groups represented by $R^1$ and $R^2$ is preferably a straight chained or a branched one having 1 to 10 carbon atoms, and includes, for example, a methylene group, an ethylene group, a propylene group, a methylethylene group, an ethylmethylene group, a butylene group, a 2-methylpropylene group, an ethylethylene group, a pentylene group, a 2,2-dimethylpropylene group, a 2-ethylpropylene group, a hexylene group, a heptylene group, an octylene group, a 2-ethylhexylene group, a nonylene group and a decylene group.

In the general formula [4], the lower alkylene group represented by $R^4$ or $R^5$ is preferably a straight chained or a branched one having 1 to 4 carbon atoms, and specifically includes, for example, a methylene group, an ethylene group, a propylene group, a methylmethylene group, a methylethylene group, an ethylmethylene group, a butylene group, a methylpropylene group and an ethylethylene group.

Further, in the general formula [4], the alkyl group and the alkyl group of the alkyl group having a phosphonic acid group represented by $Z^1$ to $Z^5$ is preferably a straight chained or a branched one having 1 to 4 carbon atoms, and includes, for example, a methyl group, an ethyl group, a n-propyl group, an isopropyl group, a n-butyl group, an isobutyl group, a sec-butyl group and a tert-butyl group. The number of phosphonic acid group in these alkyl groups is generally 1 to 2, and preferably 2.

Among them, a compound in which all of $Z^1$ to $Z^4$ and $n \times Z^5$ are alkyl groups having a phosphonic acid group in the above general formula [4] is preferable, due to a high ability to form a complex with metallic impurities. Further, n in the above general formula [4] is preferably an integer of 1 to 2, from the viewpoint of easiness in production.

Specific examples of the compound having at least one phosphonic acid group in a molecule to be used in the present invention include, for example, alkylaminopoly(alkylphosphonic acid) such as ethylaminobis(methylenephosphonic acid) and dodecylaminobis(methylenephosphonic acid); mono- or polyalkylenepolyamine poly(alkylphosphonic acid) such as ethylenediaminebis(methylenephosphonic acid) [EDDPO], ethylenediamine tetrakis(ethylenephosphonic acid), ethylenediamine tetrakis(methylenephosphonic acid) [EDDPO], hexamethylenediamine tetrakis(methylenephosphonic acid), isopropylenediamine bis(methylenephosphonic acid), isopropylenediaminetetra(methylenephosphonic acid), propanediamine tetra(ethylenephosphonic acid) [PDTMP], diaminopropanetetra (methylenephosphonic acid) [PDTPO], diethylenetriamine penta(ethylenephosphonic acid) [DEPPO], diethylenetriamine penta(methylenephosphonic acid) [DETPPO], triethylenetetramine hexa(ethylenephosphonic acid) [TETHP] and triethylenetetramine hexa(methylenephosphonic acid) [TTHPO]; nitrilopoly (alkylphosphonic acid) such as nitrilotris(methylenephosphonic acid) [NTPO]; arylphosphonic acids such as phenylphosphonic acid; alkylenepolyphosphonic acids such as alkylenediphosphonic acid and (for example, methylenediphosphonic acid); alkanepolyphosphonic acid such as alkanediphosphonic acids which may have a hydroxyl group (for example, ethylidenediphosphonic acid, 1-hydroxyethylidene-1,1'-diphosphonic acid [HEDPO], 1-hydroxypropylidene-1,1'-diphosphonic acid and 1-hydroxybutylidene-1,1'-diphosphonic acid).

The N-substituted amines include, for example, dihydroxyethylglycin [DHEG] and N-acetylglycin, and the condensated phosphoric acids include, for example, tripolyphosphoric acid and hexametaphosphoric acid.

Among the complexing agents according to the present invention as described above, a compound having at least one phosphonic acid group in a molecule is preferable. Among those compounds, nitrogen-containing polyphosphonic acids having 1 to 6 nitrogen atoms and 1 to 8 phosphonic acid groups in a molecule are more preferable and an alkane polyphosphonic acid which may have a hydroxyl group are more preferable, and a mono- or polyalkylenepolyamine poly (alkylphosphonic acid), a nitrilopoly(alkylphosphonic acid) and an alkane polyphosphonic acid which may have a hydroxyl group are perticularly preferable, because of superior solubility in water and complexation coefficients and the like.

Further, among the compounds represented by the above general formulae [1], [2] and [4], a compound represented by the general formula [2] and a compound represented by the general formula [4] are preferable, and a compound represented by the general formula [4] is particularly preferable.

More specifically, preferable examples of the complexing agent include ethylenediamine bis(methylenephosphonic acid) [EDDPO], ethylenediamine tetrakis(ethylenephosphonic acid), ethylenediamine tetrakis(methylenephosphonic acid) [EDTPO], hexamethylenediamine tetrakis(methylenephosphonic acid), isopropylenediamine bis(methylenephosphonic acid), isopropylenediamine tetra(methylenephosphonic acid), propanediamine tetra(ethylenephosphonic acid) [PDTMP], diaminopropane tetra(methylenephosphonic acid) [PDTPO], diethylenetriamine penta(ethylenephosphonic acid) [DEPPO], diethylenetriamine penta(methylenephosphonic acid) [DETPPO], triethylenetetramine hexa (ethylenephosphonic acid) [TETHP], triethylenetetramine hexa (methylenephosphonic acid) [TTHPO], nitrilotris (methylenephosphonic acid) [NTPO], ethylidenediphosphonic acid, 1-hydroxyethylidene-1,1'-diphosphonic acid [HEDPO], 1-hydroxypropylidene-1,1'-diphosphonic acid and 1-hydroxybutylidene-1,1'-diphosphonic acid.

The complexing agent according to the present invention may be used alone or in combination of two or more kinds.

The complexing agent according to the present invention is contained to capture and remove metallic impurities which are adhered to and remain on a surface of substrate, in particular, a surface of semiconductor substrate with metallic wiring provided thereon, which has been subjected to a polishing treatment, an etching treatment, a CMP treatment or the like. Metallic impurities include, for example, those derived from a transition metal such as iron (Fe), nickel (Ni) and copper (Cu); and an alkali earth metal such as calcium (Ca) and magnesium (Mg), and are, for example, these metals themselves, hydroxides thereof or oxides thereof. The complexing agents according to the present invention can remove the metallic impurities by forming a stable complex ion with these metals.

The organic acid according to the present invention is an organic acid having at least one, preferably 1 to 3, and more preferably 2 to 3 carboxyl groups, and further may have 1 to 3 hydroxyl groups and/or 1 to 3 amino groups.

Specific examples of the organic acid according to the present invention include, for example, monocarboxylic acids such as formic acid, acetic acid, propionic acid, butyric acid, n-valeric acid, 1-methylbutyric acid, 2-methylbutyric acid, caproic acid, enanthic acid, caprylic acid, trans-2-methyl-2-pentenoic acid, phenylacetic acid, 3-phenylvaleric acid, 4-phenylvaleric acid, benzoic acid, ω-cyclohexylbutyric acid, α-naphthaleneacetic acid and diphenylacetic acid; dicarboxylic acids such as oxalic acid, malonic acid, succinic acid, glutaric acid, adipic acid, pimelic acid, maleic acid, fumaric acid, phthalic acid, suberic acid, 2-n-butylmalonic acid, citraconic acid, mesaconic acid, isophthalic acid and terephthalic acid; tricarboxylic acids such as trimellitic acid, tricarbarylic acid and benzenetricarboxylic acid; oxycarboxylic acids such as oxymonocarboxylic acid [for example, hydroxyacetic acid, hydroxybutyric acid, lactic acid and salicylic acid], oxydicarboxylic acids [for example, malic acid, tartaric acid and tartronic acid], oxytricarboxylic acids [for example, citric acid]; and aminocarboxylic acids such as aspartic acid and glutamic acid.

Among the above organic acids, dicarboxylic acids and oxydicarboxylic acids are preferable.

Further, among the oxycarboxylic acids, oxydicarboxylic acids and oxytricarboxylic acids are more preferable.

More specifically, oxalic acid, malonic acid, fumaric acid, malic acid, tartaric acid and citric acid are particularly preferable.

The organic acid according to the present invention may be used alone or in combination of two or more kinds.

It is supposed that the organic acid according to the present invention dissolves a metal oxide or a metal hydroxide of Fe or Al though slightly, and formation of a metal complex between a metal ion generated by dissolution and a complexing agent results in a shift of the equilibrium towards more metal dissolution, improving dissolving power of the organic acid for metal, and thus enabling to remove a metal adsorbed on or adhered to a surface of substrate.

The cleaning agent for a substrate of the present invention (hereinafter abbreviated as "a cleaning agent of the present invention") contains an organic acid and/or a complexing agent and an organic solvent according to the present invention, in particular, the cleaning agent containing all of three components of an organic acid, a complexing agent and an organic solvent is preferable. Further, the cleaning agent of the present invention is usually in a state of solution, preferably an aqueous solution, and prepared by dissolving the organic acid and/or the complexing agent and the organic solvent according to the present invention as described above in water.

When concentration of the organic solvent according to the present invention to be used is too low, the carbon defect cannot be sufficiently removed. On the contrary, too much amount of the organic solvent according to the present invention to be used disturbs complexing agent, organic acid, surfactant or the like to exhibit performances described above sufficiently, causing a problem that the removal effect for metal impurities or particles is lowered, and is not preferable from the viewpoint of cost.

Further, when concentration of the organic acid according to the present invention or the complexing agent according to the present invention to be used is too low, the cleaning effect becomes insufficient, and sometimes very weak in the case when a surface of substrate is unexpectedly heavily contaminated. On the other hand, a too high concentration of the organic acid according to the present invention to be used does not influence the cleaning effect, but is not preferable from the viewpoint of cost. Further, a too high concentration of the complexing agent according to the present invention to be used does not influence the cleaning effect, but leads to a harmful carbon contamination on a surface of semiconductor substrate, which causes a problem in electric characteristics, and is not preferable from the viewpoint of cost.

Usually, the organic acid according to the present invention is used in a concentration range so that a ratio of the organic acid to the total amount of the cleaning agent becomes, in the lower limit, usually not lower than 0.05% by weight, preferably not lower than 0.025% by weight, more preferably not lower than 0.5% by weight, further more preferably not lower than 1% by weight, and in the upper limit, usually not higher than 50% by weight, preferably not higher than 40% by weight, more preferably not higher than 30% by weight, further more preferably not higher than 10% by weight.

The complexing agent according to the present invention is used in a concentration range so that a ratio of the complexing agent to the total amount of the cleaning agent becomes, in the lower limit, usually not lower than 0.01% by weight, preferably not lower than 0.025% by weight, more preferably not lower than 0.05% by weight, further more preferably not lower than 0.1% by weight, and in the upper limit, usually not higher than 30% by weight, preferably not higher than 10% by weight, more preferably not higher than 5% by weight, further more preferably not higher than 1% by weight.

The organic solvent according to the present invention is used in a concentration range so that a ratio of the organic solvent to the total amount of the cleaning agent becomes, in the lower limit, usually not lower than 0.05% by weight, preferably not lower than 0.1% by weight, more preferably not lower than 0.5% by weight, further more preferably not lower than 1% by weight, and in the upper limit, usually not higher than 50% by weight, preferably not higher than 40% by weight, more preferably not higher than 20% by weight, further more preferably not higher than 10% by weight.

A method for dissolving the organic acid and/or the complexing agent and the organic solvent according to the present invention in water is not particularly limited so long as a solution finally containing these components can be prepared.

Specifically, the method includes, for example, (1) a method of directly adding the organic acid and/or the complexing agent and the organic solvent according to the present invention to water, and dissolving them by stirring, (2) a method of mixing a solution containing the organic acid and/or a solution containing the complexing agent according to the present invention and a solution containing the organic solvent according to the present invention, each prepared by separately dissolving the organic acid and/or the complexing agent according to the present invention and the organic solvent according to the present invention in water, or if necessary, (3) a method of mixing a solution containing the organic acid and the complexing agent each according to the present invention prepared by directly adding the organic acid and the complexing agent each according to the present invention to water and dissolving by stirring, with a solution containing the organic solvent according to the present invention prepared by separately dissolving the organic solvent in water, (4) a method of mixing a solution containing the organic solvent and the complexing agent each according to the present invention prepared by directly adding the organic solvent and the complexing agent each according to the present invention to water and dissolving by stirring, with a solution containing the organic acid according to the present invention prepared by separately dissolving the organic acid in water, and (5) a method of mixing a solution containing the organic acid and the organic solvent each according to the present invention prepared by directly adding the organic acid and the organic solvent each according to the present invention to water and dissolving by stirring, with a solution containing the complexing agent according to the present invention prepared by separately dissolving the complexing agent in water.

The cleaning agent of the present invention thus prepared is preferably subjected to a treatment such as filtration before use. Water to be used here is preferably one purified to some extent by a treatment such as distillation and ion exchange, and more preferably so-called ultra pure water used in the art.

The cleaning agent of the present invention is preferably acidic, and pH value thereof is, in the lower limit, usually not lower than 0.5, preferably not lower than 0.7, more preferably not lower than 1, further more preferably not lower than 2, and in the upper limit, usually not higher than 6.5, preferably not lower than 5, further more preferably not higher than 3.

In the cleaning agent of the present invention, besides the organic acid, the complexing agent and the organic solvent according to the present invention as described above, various kinds of auxiliary components may be included within a range not impairing the effects of the present invention.

Such auxiliary components include those usually used in the art, and specifically, for example, a reducing agent and a metal corrosion inhibitor which are used for the purposes of protecting Cu of wiring and preventing corrosion of Cu, and a surfactant which is used for the purpose of improving wetting property of the cleaning agent to a surface of semiconductor to enhance the cleaning effect.

The reducing agent includes, for example, hydrazine and derivatives thereof, ascorbic acid and formalin. These reducing agents may be used alone or in an appropriate combination of two or more kinds.

Further, the metal corrosion inhibitor includes, as described above, aromatic compounds such as benzotriazole or derivatives thereof (for example, JP-A-51-29338, JP-A-1-195292 and JP-A-10-265979) and benzimidazoles (for example, JP-A-7-79061); cyclic compounds such as mercaptoimidazole and mercaptothiazole (for example, JP-A-2000-87268 and JP-A-2000-282096); aliphatic alcohol type compounds having a mercapto group in a molecule where a carbon to which a mercapto group is bonded and a carbon to which a hydroxyl group is bonded links together adjacently, such as mercaptoethanol and mercaptoglycerol (for example, JP-A-2000-273663); amino acids having a thiol group in a molecule such as cysteine and N-acetylcysteine (for example, JP-A-2003-13266); and thioureas. These metal corrosion inhibitors may be used alone or in an appropriate combination of two or more kinds.

The surfactant includes, for example, nonionic surfactants having a polyoxyalkylene group in a molecule; anionic surfactants having a group selected from sulfonic acid group, carboxyl group, phosphonic acid group, sulfoxyl group and phosphonoxyl group in a molecule; amphoteric surfactants such as alkylbetaine derivatives, imidazoliniumbetaine derivatives, sulfobetaine derivatives, aminocarboxylic acid derivatives, imidazoline derivatives and amine oxide derivatives.

Nonionic surfactants having a polyoxyalkylenegroup in a molecule include, for example, polyoxyalkylene alkylether and polyoxyalkylene polyalkylarylether. More specifically, nonionic surfactants include, for example, nonionic surfactants having a polyoxyehylene group in a molecule such as polyoxyethylene alkylether and polyoxyethylene alkylphenylether; nonionic surfactants having a polyoxypropylene group in a molecule such as polyoxypropylene alkylether, polyoxypropylene alkylphenylether; nonionic surfactants having a polyoxyehylene group and a polyoxypropylene group in a molecule such as polyoxyethylenepolyoxypropylene alkylether and polyoxyethylenepolyoxypropylene alkylphenylether.

Among them, particularly preferable nonionic surfactants are polyoxyalkylene alkylethers. More specifically, nonionic surfactants having a polyoxyethylene group in a molecule such as polyoxyethylene alkylether and nonionic surfactants having a polyoxyethylene and a polyoxypropylene groups in a molecule such as polyoxyethylene polyoxypropylene alkylether are particularly preferable.

Further, among polyoxyalkylene alkylethers having a polyoxyehtylene and a polyoxypropylene groups in a molecule, a compound represented by the formula: $CH_3(CH_2)_k$—O—$(CH_2CH_2O)_l$—$(CH_2CH(CH_3)O)_m$—H (wherein, k=7 to 20, preferably 11, l=4 to 20, preferably 13 to 14, m=1 to 6, preferably 1 to 2) is particularly preferable.

More specifically, methanol, ethanol, isopropyl alcohol, 2-methoxyethanol, 2-(2-butoxyethoxy)ethanol, ethyleneglycol, diethyleneglycol monomethylether, acetone, acetonitrile and polyoxyethylene polyoxypropylene alkylether (particularly $CH_3(CH_2)_{11}$—O—$(CH_2CH_2O)_{13-14}$—$(CH_2CH(CH_3)O)_{1-2}$—H) are preferable. Among them, methanol, ethanol, isopropyl alcohol, 2-methoxyethanol, ethyleneglycol, diethyleneglycol monomethylether, acetonitrile and polyoxyethylene polyoxypropylene alkylether [particularly $CH_3(CH_2)_{11}$—O—$(CH_2CH_2O)_{13-14}$—${CH_2CH(CH_3)O}_{1-2}$—H] are more preferable.

Anionic surfactants having a group selected from sulfo group, carboxylic group, phosphonic acid group, sulfoxyl group and phosphonoxyl group in a molecule include, for example, anionic surfactants having a sulfo group in a molecule such as alkylsulfonic acid, alkylbenzenesulfonic acid, alkylnaphthalene sulfonic acid, and salts thereof (for example, salts of an alkali metal such as sodium and potassium; and ammonium salt); anionic surfactants having a carboxyl group in a molecule such as alkylcarboxylic acid, alkylbenzenecarboxylic acid, alkylnaphthalenecarboxylic acid, and salts thereof (for example, salts of an alkali metal such as sodium and potassium; and ammonium salt); anionic surfactants having a phosphonic acid group in a molecule such as alkylphosphonic acid, alkylbenzenephosphonic acid, alkylnaphthalenephosphonic acid, and salts thereof (for example, salts of an alkali metal such as sodium and potassium; and ammonium salt); anionic surfactants having a sulfoxyl group in a molecule such as alkyl sulfate, alkylbenzene sulfate, polyoxyethylene alkyl sulfate, polyoxyethylene alkylbenzene sulfate, polyoxyethylene alkylnaphthalene sulfate, and salts thereof (for example, salts of an alkali metal such as sodium and potassium; and ammonium salt).

Among them, anionic surfactants having a sulfo group or a sulfoxyl group in a molecule are particularly preferable. More specifically, anionic surfactants having a sulfo group in a molecule such as alkylbenzenesulfonic acid and anionic surfactants having a sulfoxyl group in a molecule such as polyoxyethylenealkyl sulfate are particularly preferable.

Among the above mentioned surfactants, nonionic surfactants and anionic surfactants are preferable.

These compounds may be used alone or in combination of two or more kinds.

These auxiliary components may be used in such a range of concentration that they are usually used in the art. For instance, the reducing agent may be used in any amount, so long as the reducing agent can prevent oxidation of metallic Cu. The lower limit thereof is usually not less than 0.01% by weight, preferably not less than 0.05% by weight, more preferably not less than 0.07% by weight to the total amount of the cleaning agent, and the upper limit thereof is usually not more than 5% by weight, preferably not more than 1% by weight, more preferably not more than 0.5% by weight to the total amount of the cleaning agent. Further, the metal corrosion inhibitor can be used in any amount, so long as the inhibitor can suppress dissolving power of the cleaning agent for Cu by forming a weak bond with metallic Cu. The lower limit thereof is usually not less than 0.01% by weight, preferably not less than 0.05% by weight, more preferably not less than 0.1% by weight to the total amount of the cleaning agent, and the upper limit thereof is usually not more than 5% by weight, preferably not more than 1% by weight, more preferably not more than 0.5% by weight to the total amount of the cleaning agent. Also, the surfactant can be used in any amount, so long as the surfactant can lower down surface tension of the cleaning agent. The lower limit thereof is usually not less than 0.0001% by weight, preferably not less than 0.001% by weight, more preferably not less than 0.005% by weight to the total amount of the cleaning agent, and the upper limit thereof is usually not more than 1% by weight, preferably not more than 0.5% by weight, more preferably not more than 0.1% by weight to the total amount of the cleaning agent.

In this connection, in the present invention, use of the following compounds is not desirable: compounds which dissolve the metal corrosion inhibiting film (particularly a Cu-BTA film) formed on the substrate surface by decreasing pH value of the cleaning agent (for example, an inorganic acid such as hydrochloric acid, nitric acid, sulfuric acid, phosphoric acid and hydrofluoric acid), compounds which oxidize the metal corrosion inhibiting film (for example, an oxidizing agent such as phosphorus acid), and compounds which cause a defective Cu wiring or dissolution of Cu by specifically reacting with Cu ion to form a complex with Cu (for example, phenanthroline or derivatives thereof).

The cleaning agent of the present invention shows an effective cleaning effect even at room temperature, but may be used after properly warmed up, because the removal effect for fine particles is rather larger at a higher temperature. When warmed up, the lower limit of the temperature is usually not lower than 30° C., preferably not lower than 35° C., more preferably not lower than 40° C., and the upper limit thereof is usually not higher than 80° C., preferably not higher than 70° C., and more preferably not higher than 60° C.

A method for cleaning a surface of substrate of the present invention may be treating the surface of semiconductor with the cleaning agent of the present invention as described above.

As a method for treating a surface of substrate with the cleaning agent of the present invention, any method may be used so long as the cleaning agent of the present invention can contact with a surface of substrate, and methods which are commonly employed in the art and already known are used.

Specifically, those includes, for example, a method where the cleaning agent of the present invention is simply coated on a surface of substrate, a method where a substrate is dipped in the cleaning agent of the present invention (dipping treatment), a method where the cleaning agent of the present invention is sprinkled like a shower or sprayed on a surface of substrate (single-wafer-based treatment).

Moreover, in the present invention, particles, metallic impurities and a carbon defect can be more effectively removed by using a physical cleaning in combination in the cleaning.

Specific methods of the combined use include subjecting a surface of substrate to a physical cleaning process in the presence of the cleaning agent of the present invention.

In the above-described method, a method for providing the cleaning agent of the present invention includes, for example, a method to apply a physical cleaning process in a state in which a cleaning agent of the present invention exist specifically by the above described method for cleaning the surface of substrate (coating method, dipping treatment and single-wafer-based treatment). Further, the physical cleaning (process) includes, for example, brush-scrub cleaning where a surface of substrate is cleaned with a brush made of polyvinyl alcohol rotating at a high speed and megasonic cleaning where high frequency wave is used.

A more specific technique when physical cleaning is used in combination includes, for example, a method to apply a physical cleaning after providing a cleaning agent of the present invention on the surface of a semiconductor by coating said cleaning agent on the surface of a semiconductor, a method to apply a physical cleaning after providing a cleaning agent of the present invention on the surface of a semiconductor by dipping the semiconductor in said cleaning agent, then taking it out of said cleaning agent, a method to apply a physical cleaning while a semiconductor is dipped in a cleaning agent of the present invention, a method to apply a physical cleaning after providing a cleaning agent of the present invention on the surface of a semiconductor by showering said cleaning agent on the surface of the semiconductor, or a method to apply a physical cleaning while a cleaning agent of the present invention is showered on the surface of a semiconductor.

Since the cleaning agent of the present invention has not only capability of removing a carbon defect, but also capability of removing particles and metallic impurities, not only a carbon defect, but also particles and metallic impurities which remain on or adhered to a surface of substrate can be removed (cleaned) at the same time, by treating the surface of substrate with the cleaning agent of the present invention.

Thus, the surface of substrate can be sufficiently cleaned only by using the cleaning agent of the present invention, but the surface of substrate may be subjected to the cleaning method using the cleaning agent of the present invention as described above, then further cleaned with a cleaning agent for a substrate which is already known.

By treating in such way, it becomes possible to clean a surface of substrate with high precision. In this connection, as the already known cleaning agent for a substrate to be used, cleaning agents usually used in the art can be used, as disclosed, for instance, in JP-A-4-130100, JP-A-5-263275, JP-A-6-112646, JP-A-6-287774, JP-A-7-79061, JP-A-7-166381, JP-A-7-267933, JP-A-7-292483, JP-A-7-54169, JP-A-10-26832, JP-A-10-72594, JP-A-10-251867, JP-A-11-50275, JP-A-2000-8185 and JP-A-2002-20787. Among them, a so-called acidic cleaning agent is preferable.

The cleaning agent of the present invention can be used, for example, for a substrate of semiconductor such as a so-called silicone wafer and a semiconductor of compounds (for example GaAs and GaP), a printed circuit board such as a polyimide resin, and a glass substrate for LCD and PDP, and is particularly useful for a substrate of semiconductor.

Further, among these substrates, the cleaning agent of the present invention is useful for a substrate which is provided with wiring of metals such as copper, silver, aluminum, tungsten-plug, chrome and gold on the surface thereof, and among them, for a substrate which is provided with copper or silver wiring, and particularly for a substrate which is provided with copper wiring, and is most useful for a substrate of semiconductor which is provided with copper wiring on the surface thereof.

Effect of the Invention

By using the cleaning agent of the present invention, fine particles (particles) and impurities derived from various kinds of metals (metallic impurities) present on a surface of substrate can be effectively removed without causing corrosion or oxidation of metallic wiring, especially copper wiring provided on the substrate surface, and further, a carbon defect present on the substrate surface can also be removed at the same time without removing a metal corrosion inhibitor—Cu film, in particular, a Cu-BTA film.

Hereinafter, the present invention will be explained in detail by illustrating Examples and Comparative Examples, but the present invention should not be construed to be limited thereby in the least.

A metallic Cu deposited wafer, a wafer provided with a Cu-BTA film, a wafer contaminated with a carbon defect and a wafer contaminated with a metal used in the present Examples and Comparative Examples are prepared according to the following methods and used, and a thickness of Cu film on a surface of the metallic Cu deposited wafer, a thickness of Cu-BTA film on a surface of the wafer provided with a Cu-BTA film, and an adsorption amount (a remaining metal concentration) of metal (Fe atom, Al atom and Cu atom) adsorbed and remaining on a surface of the wafer contaminated with a metal were measured according to the following methods, respectively.

[Metallic Cu Deposited Wafer]

The metallic Cu deposited wafer was obtained by depositing metallic Cu on a surface of 4-inch silicone wafer by a sputtering method.

In this connection, it was confirmed by the method shown below that a thickness of copper on a surface of said metallic Cu deposited wafer was 1,000 nm.

[Wafer Provided with a Cu-BTA Film]

The wafer provided with a Cu-BTA film was obtained by oxidizing a Cu surface of the metallic Cu deposited wafer with 0.1% $H_2O_2$ for 15 min, thereafter dipping in 1% aqueous BTA solution for 20 min.

In this connection, it was confirmed by the method shown below that a thickness of Cu-BTA film on a surface of said wafer provided with a Cu-BTA film was 100 nm.

[Wafer Contaminated with a Carbon Defect]

The wafer contaminated with a carbon defect was obtained by dipping the wafer provided with a Cu-BTA film in a saturated BTA aqueous solution at 80° C. for 40 min, then cooling the wafer at 10° C. under the nitrogen atmosphere.

In this connection, it was confirmed by direct measurement using an Auger photoelectron spectroscopic analyzer that the carbon defect was adsorbed and remaining on a Cu-BTA film of the wafer surface.

[Wafer Contaminated with Metal]

The wafer contaminated with metal was obtained dipping a 6-inch silicone wafer, surface of which was oxidized to $SiO_2$ by thermal oxidation, in 1 L of an aqueous slurry (a 0.1% hydrogen peroxide aqueous containing 1% of silica) added with Fe ion so as to be 0.1 ppm, 1 L of an aqueous slurry (a 0.1% hydrogen peroxide containing 1% of silica) added with Al ion so as to be 0.1 ppm, or 1 L of an aqueous slurry (a 0.1% hydrogen peroxide containing 1% of silica) added with Cu ion so as to be 0.1 ppm, each for 1 min, respectively, then rinsing the wafer with flowing ultra pure water for 10 min, followed by spin-drying.

In this connection, it was confirmed by the methods shown below, that $5 \times 10^{13}$ atom/cm$^2$ of Fe (iron atom), $8 \times 10^{13}$ atom/cm$^2$ of Al (aluminum atom), or $3 \times 10^{14}$ atom/cm$^2$ of Cu (copper atom) was adsorbed and remaining, respectively.

[Wafer Contaminated with Particles]

The wafer contaminated with particles was obtained by dipping a wafer provided with a Cu-BTA film in an aqueous slurry of 3% alumina having an average particle diameter of 0.2 μm for 1 min, then rinsing the wafer with flowing ultra pure water for 10 min, followed by spin-drying.

In this connection, it was confirmed by the method shown below that about 8,000 particles per 6-inch wafer were adsorbed and remaining on said wafer.

[Measuring Method for Thickness of Metallic Cu Film]

A wafer was divided into two halves, and a thickness of metallic Cu film was measured by observing the cross section thereof using an electron microscope.

[Measuring Method for Thickness of Cu-BTA Film]

A wafer was divided into two halves, and thickness of a Cu-BTA film was measured by observing the cross section thereof using a SEM (a scanning electron microscope).

[Measuring Method for Metal Concentration]

Metals (Fe, Al and Cu) adsorbed and remaining on the wafer surface were dissolved with an aqueous solution of hydrofluoric acid and nitric acid and recovered, then metal concentration in said recovered solution was measured by an atomic absorption spectrometry (a graphite furnace atomic absorption spectrometer). Adsorption amounts (remaining metal concentrations) of metal atoms (Fe atom, Al atom and Cu atom) were calculated based on the measured values obtained.

[Measuring Method for Number of Particle]

Particles adsorbed and remaining on the wafer surface were measured using a surface foreign material inspection apparatus (a particle counter).

In this connection, in the present Examples and Comparative Examples, all of %, ppm and ppb representing a concentration are based on a weight ratio, unless otherwise noted. Further, all of waters used were ultra pure water, and were used after confirming that Fe, Al or Cu contained was not more than 0.01 ppb, respectively.

EXAMPLES

Examples 1 to 44

Each of the wafers contaminated with a carbon defect, prepared from the wafer provided with a Cu-BTA film, which was prepared from the metallic Cu deposited wafer by the above-described methods, was dipped in 1 L of each cleaning agent described in Table 1 at room temperature for 5 hours. Thereafter, each of wafers was taken out, rinsed with ultra pure water for 10 min, and spin-dried.

The presence of the carbon defect adsorbed and remaining on said wafer surface was confirmed to evaluate capability of removing carbon defect, by direct measurement using an Auger photoelectron spectroscopic analyzer.

The thickness of the Cu-BTA film on the wafer surface was measured to confirm an influence (occurrence of dissolution and elution) on the Cu-BTA film.

Further, the color tone of the Cu film surface on the wafer surface was checked by visual examination to confirm oxidation of metallic Cu, and the film thickness of metallic Cu on the wafer surface was measured to confirm occurrence of corrosion on the metallic Cu.

The results are shown in Table 1.

TABLE 1

| Ex. | Organic acid | conc. (% by WT) | Complexing agent | conc. (% by WT) | Organic solvent | conc. (% by WT) | pH | Ability for removing carbon defect | Thickness of Cu-BTA film (nm) | Color tone of Cu film | Thickness of Cu film (nm) |
|---|---|---|---|---|---|---|---|---|---|---|---|
| 1 | oxalic acid | 5 | — | | methanol | 0.2 | 2 | ○ | 100 | metallic luster | 1000 |
| 2 | oxalic acid | 5 | — | | ethanol | 0.2 | 2 | ○ | 100 | metallic luster | 1000 |
| 3 | oxalic acid | 5 | — | | isopropyl-alcohol | 0.2 | 2 | ○ | 90 | metallic luster | 1000 |
| 4 | oxalic acid | 5 | — | | 2-methoxy-ethanol | 0.2 | 2 | ○ | 100 | metallic luster | 1000 |
| 5 | oxalic acid | 2 | — | | ethylene glycol | 3 | 2 | ○ | 100 | metallic luster | 1000 |
| 6 | oxalic acid | 5 | — | | acetone | 0.2 | 2 | ○ | 100 | metallic luster | 1000 |
| 7 | oxalic acid | 5 | — | | aceto-nitrile | 0.2 | 2 | ○ | 100 | metallic luster | 1000 |
| 8 | citric acid | 5 | — | | methanol | 0.2 | 2 | ○ | 100 | metallic luster | 1000 |
| 9 | citric acid | 5 | — | | ethanol | 0.2 | 2 | ○ | 100 | metallic luster | 1000 |
| 10 | citric acid | 10 | — | | isopropyl-alcohol | 0.2 | 2 | ○ | 90 | metallic luster | 1000 |
| 11 | citric acid | 5 | — | | 2-methoxy-ethanol | 5 | 2 | ○ | 100 | metallic luster | 900 |
| 12 | citric acid | 5 | — | | ethylene glycol | 0.2 | 2 | ○ | 100 | metallic luster | 1000 |
| 13 | citric acid | 25 | — | | acetone | 10 | 1 | ○ | 100 | metallic luster | 1000 |
| 14 | citric acid | 5 | — | | aceto-nitrile | 10 | 2 | ○ | 100 | metallic luster | 900 |
| 15 | — | | EDTA | 0.01 | methanol | 10 | 5 | ○ | 100 | metallic luster | 1000 |
| 16 | — | | CyDTA | 0.01 | methanol | 0.2 | 5 | ○ | 100 | metallic luster | 1000 |
| 17 | — | | CyDTA | 0.01 | ethylene glycol | 10 | 5 | ○ | 100 | metallic luster | 1000 |
| 18 | — | | HEDPO | 5 | methanol | 0.2 | 1 | ○ | 100 | metallic luster | 1000 |
| 19 | — | | HEDPO | 0.1 | aceto-nitrile | 10 | 3 | ○ | 100 | metallic luster | 1000 |
| 20 | — | | EDTPO | 0.1 | isopropyl-alcohol | 0.2 | 3 | ○ | 100 | metallic luster | 1000 |
| 21 | acetic acid | 5 | EDTA | 0.1 | methanol | 0.2 | 2 | ○ | 90 | metallic luster | 1000 |
| 22 | oxalic acid | 5 | EDTA | 0.1 | methanol | 10 | 2 | ○ | 100 | metallic luster | 1000 |
| 23 | oxalic acid | 5 | EDTA | 0.1 | acetone | 0.2 | 2 | ○ | 100 | metallic luster | 1000 |
| 24 | oxalic acid | 5 | CyDTA | 0.01 | methanol | 10 | 2 | ○ | 90 | metallic luster | 1000 |
| 25 | oxalic acid | 2 | CyDTA | 0.01 | ethylene glycol | 0.2 | 2 | ○ | 100 | metallic luster | 1000 |
| 26 | oxalic acid | 5 | HEDPO | 0.1 | methanol | 0.2 | 2 | ○ | 100 | metallic luster | 1000 |
| 27 | oxalic acid | 1 | EDTPO | 0.1 | isopropyl-alcohol | 10 | 2 | ○ | 100 | metallic luster | 1000 |
| 28 | oxalic acid | 5 | DEPPO | 1 | isopropyl-alcohol | 0.2 | 2 | ○ | 100 | metallic luster | 1000 |
| 29 | citric acid | 5 | EDTA | 0.01 | methanol | 0.2 | 2 | ○ | 100 | metallic luster | 1000 |
| 30 | citric acid | 5 | EDTA | 0.01 | ethanol | 5 | 2 | ○ | 100 | metallic luster | 1000 |

TABLE 1-continued

| Ex. | Organic acid | conc. (% by WT) | Complexing agent | conc. (% by WT) | Organic solvent | conc. (% by WT) | pH | Ability for removing carbon defect | Thickness of Cu-BTA film (nm) | Color tone of Cu film | Thickness of Cu film (nm) |
|---|---|---|---|---|---|---|---|---|---|---|---|
| 31 | citric acid | 5 | EDTA | 0.01 | isopropyl-alcohol | 0.2 | 2 | ○ | 100 | metallic luster | 1000 |
| 32 | citric acid | 20 | EDTA | 0.01 | acetone | 0.2 | 1 | ○ | 100 | metallic luster | 1000 |
| 33 | citric acid | 5 | CyDTA | 0.01 | methanol | 10 | 2 | ○ | 90 | metallic luster | 1000 |
| 34 | citric acid | 5 | CyDTA | 0.01 | ethylene glycol | 0.2 | 2 | ○ | 100 | metallic luster | 1000 |
| 35 | citric acid | 10 | EDTA | 0.01 | diethylene glycol | 0.2 | 2 | ○ | 100 | metallic luster | 1000 |
| 36 | citric acid | 5 | CyDTA | 0.01 | acetone | 0.2 | 2 | ○ | 90 | metallic luster | 1000 |
| 37 | citric acid | 5 | EDTA | 0.01 | acetonitrile | 0.2 | 2 | ○ | 100 | metallic luster | 1000 |
| 38 | citric acid | 5 | TETHP | 0.03 | methanol | 0.2 | 2 | ○ | 100 | metallic luster | 1000 |
| 39 | citric acid | 20 | HEDPO | 5 | methanol | 8 | 1 | ○ | 100 | metallic luster | 1000 |
| 40 | citric acid | 5 | EDTPO | 0.1 | isopropyl-alcohol | 10 | 2 | ○ | 100 | metallic luster | 1000 |
| 41 | citric acid | 5 | TETHP | 0.1 | 2-methoxy-ethanol | 0.2 | 2 | ○ | 100 | metallic luster | 1000 |
| 42 | citric acid | 5 | DEPPO | 0.1 | ethylene glycol | 0.2 | 2 | ○ | 100 | metallic luster | 1000 |
| 43 | citric acid | 10 | DEPPO | 5 | diethylene glycol | 5 | 1 | ○ | 100 | metallic luster | 1000 |
| 44 | citric acid | 5 | DEPPO | 0.1 | diethylene glycol | 0.2 | 2 | ○ | 100 | metallic luster | 1000 |

Comparative Examples 1 to 82

A wafer contaminated with a carbon defect, a wafer provided with a Cu-BTA film and a metallic Cu deposited wafer were treated in the same manner as in Examples 1 to 44 except that various solutions described in Table were used, thereafter similar measurement and evaluation to those in Examples 1 to 44 were carried out on each of these wafers.

The results are shown in Table 3.

TABLE 2

| Comp. Ex. | Organic acid | conc. (% by WT) | Complexing agent | conc. (% by WT) | Organic solvent | conc. (% by WT) | pH | Ability for removing carbon defect | Thickness of Cu-BTA film (nm) | Color tone of Cu film | Thickness of Cu film (nm) |
|---|---|---|---|---|---|---|---|---|---|---|---|
| 1 | — | | — | | — | | 7 | X | 100 | metallic luster | 1000 |
| 2 | hydrochloric acid | 1 | — | | — | | 1 | — | 0 | loss of luster | 400 |
| 3 | oxalic acid | 5 | — | | — | | 2 | X | 100 | metallic luster | 1000 |
| 4 | citric acid | 5 | — | | — | | 2 | X | 100 | metallic luster | 1000 |
| 5 | — | | EDTA | 0.01 | — | | 5 | X | 100 | metallic luster | 1000 |
| 6 | — | | CyDTA | 0.01 | — | | 5 | X | 100 | metallic luster | 900 |
| 7 | — | | HEDPO | 0.1 | — | | 3 | X | 100 | metallic luster | 1000 |
| 8 | — | | EDTPO | 0.1 | — | | 3 | X | 100 | metallic luster | 1000 |
| 9 | — | | — | | methanol | 0.2 | 7 | X | 100 | metallic luster | 1000 |
| 10 | — | | — | | acetonitrile | 0.2 | 7 | X | 100 | metallic luster | 1000 |
| 11 | — | | — | | dimethylsulfoxide | 0.2 | 7 | X | 100 | metallic luster | 1000 |
| 12 | — | | — | | dimethylformamide | 0.2 | 7 | X | 100 | metallic luster | 1000 |
| 13 | phosphoric acid | 2 | CyDTA | 0.01 | — | | 2 | X | 100 | metallic luster | 950 |
| 14 | acetic acid | 4 | HEDPO | 0.1 | — | | 2 | X | 90 | metallic luster | 1000 |

TABLE 2-continued

| Comp. Ex. | Organic acid | conc. (% by WT) | Complexing agent | conc. (% by WT) | Organic solvent | conc. (% by WT) | pH | Ability for removing carbon defect | Thickness of Cu-BTA film (nm) | Color tone of Cu film | Thickness of Cu film (nm) |
|---|---|---|---|---|---|---|---|---|---|---|---|
| 15 | oxalic acid | 5 | EDTA | 0.01 | — | | 2 | X | 100 | metallic luster | 1000 |
| 16 | oxalic acid | 5 | HEDPO | 0.1 | — | | 2 | X | 100 | metallic luster | 1000 |
| 17 | oxalic acid | 5 | CyDTA | 0.01 | — | | 2 | X | 100 | metallic luster | 900 |
| 18 | oxalic acid | 5 | EDTPO | 0.1 | — | | 2 | X | 100 | metallic luster | 1000 |
| 19 | citric acid | 5 | EDTA | 0.01 | — | | 2 | X | 100 | metallic luster | 1000 |
| 20 | citric acid | 5 | HEDPO | 0.1 | — | | 2 | X | 100 | metallic luster | 1000 |
| 21 | citric acid | 5 | CyDTA | 0.01 | — | | 2 | X | 100 | metallic luster | 1000 |
| 22 | citric acid | 5 | EDTPO | 0.1 | — | | 2 | X | 90 | metallic luster | 1000 |
| 23 | oxalic acid | 5 | — | | dimethyl-sulfoxide | 3 | 2 | X | 100 | metallic luster | 1000 |
| 24 | oxalic acid | 5 | — | | dimethyl-formamide | 3 | 2 | X | 100 | metallic luster | 1000 |
| 25 | oxalic acid | 5 | — | | γ-butyro-lactone | 3 | 2 | X | 100 | metallic luster | 900 |
| 26 | oxalic acid | 5 | — | | tetrahydro-furan | 3 | 2 | X | 100 | metallic luster | 1000 |
| 27 | citric acid | 5 | — | | dimethyl-sulfoxide | 3 | 2 | X | 100 | metallic luster | 1000 |
| 28 | citric acid | 5 | — | | dimethyl-formamide | 3 | 2 | X | 100 | metallic luster | 1000 |
| 29 | citric acid | 5 | — | | γ-butyro-lactone | 3 | 2 | X | 100 | metallic luster | 1000 |
| 30 | citric acid | 5 | — | | tetrahydro-furan | 3 | 2 | X | 100 | metallic luster | 1000 |
| 31 | — | | EDTA | 0.01 | dimethyl-sulfoxide | 3 | 5 | X | 90 | metallic luster | 1000 |
| 32 | — | | HEDPO | 1 | dimethyl-sulfoxide | 3 | 3 | X | 90 | metallic luster | 1000 |
| 33 | — | | CyDTA | 0.01 | dimethyl-formamide | 3 | 5 | X | 100 | metallic luster | 1000 |
| 34 | — | | HEDPO | 5 | dimethyl-formamide | 3 | 3 | X | 100 | metallic luster | 1000 |
| 35 | — | | TETHP | 0.03 | dimethyl-formamide | 3 | 3 | X | 100 | metallic luster | 1000 |
| 36 | — | | TETHP | 0.03 | γ-butyro-lactone | 3 | 3 | X | 90 | metallic luster | 1000 |
| 37 | — | | EDTA | 0.01 | tetrahydro-furan | 3 | 3 | X | 90 | metallic luster | 1000 |
| 38 | — | | CyDTA | 0.01 | methyl 3-methoxy propionate | 3 | 3 | X | 100 | metallic luster | 1000 |
| 39 | phosphoric acid | 2 | EDTA | 0.01 | methanol | 3 | 2 | X | 100 | metallic luster | 950 |
| 40 | hydro-chloric acid | 1 | EDTPO | 0.1 | methanol | 3 | 1 | — | 0 | loss of luster | 500 |
| 41 | nitric acid | 0.5 | HEDPO | 0.1 | methanol | 3 | 1 | — | 0 | loss of luster | 400 |
| 42 | nitric acid | 0.5 | EDTA | 0.01 | ethanol | 3 | 1 | — | 0 | loss of luster | 400 |
| 43 | nitric acid | 0.5 | TETHP | 0.1 | isopropyl-alcohol | 3 | 1 | — | 0 | loss of luster | 400 |
| 44 | nitric acid | 0.5 | DEPPO | 5 | 2-methoxy-ethanol | 3 | 1 | — | 0 | loss of luster | 400 |
| 45 | nitric acid | 0.5 | EDTA | 0.01 | 2-(2-butoxy-ethoxy) ethanol | 3 | 1 | — | 0 | loss of luster | 400 |
| 46 | nitric acid | 0.5 | EDTA | 0.01 | ethylene glycol | 3 | 1 | — | 0 | loss of luster | 500 |
| 47 | nitric acid | 0.5 | EDTA | 0.01 | diethylene glycol | 3 | 1 | — | 0 | loss of luster | 400 |
| 48 | nitric acid | 0.5 | EDTA | 0.01 | acetone | 3 | 1 | — | 0 | loss of luster | 500 |

TABLE 3

| Comp. Ex. | Organic acid | conc. (% by WT) | Complexing agent | conc. (% by WT) | Organic solvent | conc. (% by WT) | pH | Ability for removing carbon defect | Thickness of Cu-BTA film (nm) | Color tone of Cu film | Thickness of Cu film (nm) |
|---|---|---|---|---|---|---|---|---|---|---|---|
| 49 | nitric acid | 0.5 | HEDPO | 0.1 | acetonitrile | 3 | 1 | — | 0 | loss of luster | 500 |
| 50 | hydrofluoric acid | 0.1 | EDTA | 0.01 | methanol | 3 | 1 | — | 0 | loss of luster | 500 |
| 51 | hydrofluoric acid | 0.1 | TETHP | 0.01 | ethanol | 3 | 1 | — | 0 | loss of luster | 400 |
| 52 | hydrofluoric acid | 0.1 | DEPPO | 1 | isopropylalcohol | 3 | 1 | — | 0 | loss of luster | 400 |
| 53 | hydrofluoric acid | 0.1 | EDTA | 0.01 | 2-methoxyethanol | 3 | 1 | — | 0 | loss of luster | 400 |
| 54 | hydrofluoric acid | 0.1 | DEPPO | 0.1 | 2-(2-butoxyethoxy) ethanol | 3 | 1 | — | 0 | loss of luster | 400 |
| 55 | hydrofluoric acid | 0.1 | EDTA | 0.01 | ethylene glycol | 3 | 1 | — | 0 | loss of luster | 400 |
| 56 | hydrofluoric acid | 0.1 | TETHP | 0.03 | diethylene glycol | 3 | 1 | — | 0 | loss of luster | 400 |
| 57 | hydrofluoric acid | 0.1 | EDTA | 0.01 | acetone | 3 | 1 | — | 0 | loss of luster | 400 |
| 58 | hydrofluoric acid | 0.1 | EDTA | 0.01 | acetonitrile | 3 | 1 | — | 0 | loss of luster | 400 |
| 59 | nitric acid | 0.5 | EDTA | 0.01 | dimethylsulfoxide | 3 | 1 | — | 0 | loss of luster | 400 |
| 60 | nitric acid | 0.5 | TETHP | 0.1 | dimethylformamide | 3 | 1 | — | 0 | loss of luster | 400 |
| 61 | nitric acid | 0.5 | TETHP | 0.1 | γ-butyrolactone | 3 | 1 | — | 0 | loss of luster | 400 |
| 62 | nitric acid | 0.5 | DEPPO | 2 | tetrahydrofuran | 3 | 1 | — | 0 | loss of luster | 400 |
| 63 | nitric acid | 0.5 | EDTA | 0.01 | methyl 3-methoxy propionate | 3 | 1 | — | 0 | loss of luster | 400 |
| 64 | hydrofluoric acid | 0.1 | CyDTA | 0.01 | dimethylsulfoxide | 3 | 1 | — | 0 | loss of luster | 500 |
| 65 | hydrofluoric acid | 0.1 | EDTA | 1 | dimethylformamide | 3 | 1 | — | 0 | loss of luster | 400 |
| 66 | hydrofluoric acid | 0.1 | TETHP | 0.1 | γ-butyrolactone | 3 | 1 | — | 0 | loss of luster | 400 |
| 67 | hydrofluoric acid | 0.1 | EDTA | 0.01 | tetrahydrofuran | 3 | 1 | — | 0 | loss of luster | 400 |
| 68 | hydrofluoric acid | 0.1 | EDTA | 0.01 | methyl 3-methoxy propionate | 3 | 1 | — | 0 | loss of luster | 400 |
| 69 | oxalic acid | 5 | EDTA | 0.01 | dimethylsulfoxide | 3 | 2 | X | 100 | metallic luster | 1000 |
| 70 | oxalic acid | 5 | CyDTA | 0.01 | dimethylformamide | 3 | 2 | X | 100 | metallic luster | 1000 |
| 71 | citric acid | 5 | EDTA | 0.01 | dimethylsulfoxide | 3 | 2 | X | 90 | metallic luster | 1000 |
| 72 | citric acid | 4 | TETHP | 0.1 | dimethylsulfoxide | 3 | 2 | X | 100 | metallic luster | 1000 |
| 73 | citric acid | 10 | CyDTA | 0.01 | dimethylformamide | 3 | 2 | X | 90 | metallic luster | 1000 |
| 74 | citric acid | 5 | HEDPO | 1 | dimethylformamide | 3 | 2 | X | 100 | metallic luster | 1000 |
| 75 | citric acid | 20 | TTHA | 0.01 | γ-butyrolactone | 3 | 1 | X | 100 | metallic luster | 1000 |
| 76 | citric acid | 5 | EDTA | 0.1 | tetrahydrofuran | 3 | 2 | X | 90 | metallic luster | 1000 |
| 77 | citric acid | 5 | HEDPO | 0.5 | methyl 3-methoxy propionate | 3 | 2 | X | 100 | metallic luster | 1000 |

TABLE 3-continued

| Comp. Ex. | Organic acid | conc. (% by WT) | Complexing agent | conc. (% by WT) | Organic solvent | conc. (% by WT) | pH | Ability for removing carbon defect | Thickness of Cu-BTA film (nm) | Color tone of Cu film | Thickness of Cu film (nm) |
|---|---|---|---|---|---|---|---|---|---|---|---|
| 78 | citric acid | 5 | hexametaphosphoric acid | 0.1 | — | | 2 | X | 100 | metallic luster | 1000 |
| 79 | citric acid | 10 | ammonium fluoride | 1 | — | | 2 | — | 0 | loss of luster | 400 |
| 80 | citric acid | 5 | ammonium fluoride | 0.1 | — | | 2 | — | 0 | loss of luster | 400 |
| 81 | citric acid | 5 | ammonium fluoride | 0.2 | — | | 2 | — | 0 | loss of luster | 400 |
| 82 | citric acid | 5 | ammonium fluoride | 0.2 | — | | 2 | — | 0 | loss of luster | 400 |

As apparent from Tables 1, 2 and 3, when the cleaning agents of the present invention are used (Examples 1 to 44), followings can be understood: (1) carbon defect can be well removed; (2) color tone of a surface of Cu film on a wafer surface is not changed, proving that the metallic Cu has not been oxidized; (3) thickness of a Cu film shows little change, proving that the metallic Cu has not been corroded; (4) thickness of a Cu-BTA film shows little change, proving that the Cu-BTA film has been hardly removed.

On the contrary, it can be understood that a carbon defect cannot be removed when an organic acid (Comparative Examples 2 to 4), a complexing agent (Comparative Examples 5 to 8) or an organic solvent (Comparative Examples 9 to 12) is used alone, or when only an organic acid and a complexing agent are used in combination (Comparative Examples 13 to 22 and Comparative Examples 78 to 82).

Further, as apparent from a comparison between Examples 1 to 14 and Comparative Examples 23 to 30, a comparison between Examples 15 to 20 and Comparative Examples 31 to 38, and a comparison between Examples 39 to 48 and Comparative Examples 69 to 77, it can be understood respectively that a carbon defect cannot be removed when a cleaning agent containing an organic solvent other than the organic solvent according to the present invention is used. Furthermore, as apparent from a comparison between Examples 21 to 44 and Comparative Examples 39 to 68, it can be also understood that a carbon defect cannot be removed or a Cu-BTA film or a Cu film is dissolved, when a cleaning agent containing an acid other than the organic acid according to the present invention is used.

As apparent from the above, it can be understood that a carbon defect can be well removed without causing corrosion or oxidation of Cu or further losing a Cu-BTA film, only when the specified organic acid and/or the specified complexing agent and the specified organic solvent according to the present invention are used in combination.

Examples 45 to 76

Each of the wafers contaminated with metals prepared by the above-described method was dipped in 1 L each of cleaning agents described in Table 4, at room temperature for 1 hour. Thereafter, the wafer was taken out, rinsed with ultra pure water for 10 min, and spin-dried.

For the wafers contaminated with metals thus treated, remaining metal concentrations (remaining Fe concentration, remaining Al concentration, and remaining Cu concentration) adsorbed and remaining on a surface of the wafer were measured, to evaluate capability of removing metallic impurities.

The results are shown in Table 4.

TABLE 4

| Ex. | Organic acid | conc. (% by WT) | Complexing agent | conc. (% by WT) | Organic solvent | conc. (% by WT) | pH | remaining Fe conc. (Fe atom/cm$^2$) | remaining Al conc. (Al atom/cm$^2$) | remaining Cu conc. (Cu atom/cm$^2$) |
|---|---|---|---|---|---|---|---|---|---|---|
| 45 | citric acid | 5 | — | | methanol | 0.2 | 2 | $4 \times 10^{13}$ | $9 \times 10^{12}$ | $2 \times 10^{12}$ |
| 46 | acetic acid | 5 | — | | methanol | 0.2 | 2 | $6 \times 10^{12}$ | $4 \times 10^{12}$ | $4 \times 10^{12}$ |
| 47 | malonic acid | 5 | — | | isopropylalcohol | 5 | 3 | $7 \times 10^{12}$ | $8 \times 10^{12}$ | $3 \times 10^{12}$ |
| 48 | fumaric acid | 5 | — | | 2-methoxyethanol | 10 | 3 | $3 \times 10^{12}$ | $2 \times 10^{12}$ | $1 \times 10^{13}$ |
| 49 | malic acid | 5 | — | | ethylene glycol | 2 | 3 | $9 \times 10^{12}$ | $5 \times 10^{12}$ | $7 \times 10^{12}$ |
| 50 | tartaric acid | 5 | — | | diethylene glycol monomethyl ether | 5 | 3 | $5 \times 10^{12}$ | $9 \times 10^{12}$ | $8 \times 10^{12}$ |
| 51 | oxalic acid | 5 | — | | acetone | 0.2 | 2 | $6 \times 10^{12}$ | $7 \times 10^{12}$ | $3 \times 10^{12}$ |
| 52 | oxalic acid | 5 | — | | acetonitrile | 0.2 | 2 | $1 \times 10^{13}$ | $3 \times 10^{12}$ | $9 \times 10^{12}$ |
| 53 | — | | EDTA | 0.01 | methanol | 0.2 | 5 | $4 \times 10^{12}$ | $6 \times 10^{12}$ | $8 \times 10^{12}$ |
| 54 | — | | DEPPO | 0.1 | methanol | 0.2 | 3 | $4 \times 10^{12}$ | $1 \times 10^{11}$ | $5 \times 10^{11}$ |
| 55 | — | | EDTPO | 5 | isopropylalcohol | 0.2 | 2 | $6 \times 10^{11}$ | $4 \times 10^{11}$ | $6 \times 10^{11}$ |
| 56 | — | | CyDTA | 0.01 | 2-methoxyethanol | 0.2 | 5 | $3 \times 10^{12}$ | $7 \times 10^{12}$ | $4 \times 10^{12}$ |
| 57 | — | | HEDPO | 0.1 | 2-methoxyethanol | 0.2 | 5 | $4 \times 10^{11}$ | $2 \times 10^{12}$ | $7 \times 10^{11}$ |
| 58 | — | | HEDPO | 0.1 | ethylene glycol | 0.2 | 3 | $2 \times 10^{12}$ | $1 \times 10^{11}$ | $3 \times 10^{11}$ |

TABLE 4-continued

| Ex. | Organic acid | conc. (% by WT) | Complexing agent | conc. (% by WT) | Organic solvent | conc. (% by WT) | pH | remaining Fe conc. (Fe atom/cm$^2$) | remaining Al conc. (Al atom/cm$^2$) | remaining Cu conc. (Cu atom/cm$^2$) |
|---|---|---|---|---|---|---|---|---|---|---|
| 59 | — | | DETPPO | 5 | diethylene glycol monomethyl ether | 0.2 | 2 | $4 \times 10^{11}$ | $6 \times 10^{11}$ | $4 \times 10^{11}$ |
| 60 | — | | DETPPO | 0.1 | diethylene glycol monomethyl ether | 0.2 | 3 | $2 \times 10^{11}$ | $4 \times 10^{11}$ | $4 \times 10^{11}$ |
| 61 | — | | HEDPO | 0.1 | acetone | 5 | 3 | $4 \times 10^{11}$ | $3 \times 10^{11}$ | $4 \times 10^{11}$ |
| 62 | — | | PTDMP | 0.1 | acetone | 0.2 | 3 | $2 \times 10^{11}$ | $2 \times 10^{11}$ | $9 \times 10^{11}$ |
| 63 | — | | EDTA | 0.1 | acetonitrile | 5 | 5 | $7 \times 10^{12}$ | $5 \times 10^{12}$ | $7 \times 10^{12}$ |
| 64 | — | | EDDPO | 0.1 | acetonitrile | 0.2 | 3 | $2 \times 10^{11}$ | $4 \times 10^{11}$ | $3 \times 10^{11}$ |
| 65 | citric acid | 10 | EDTA | 0.01 | methanol | 0.2 | 2 | $7 \times 10^{11}$ | $9 \times 10^{11}$ | $8 \times 10^{11}$ |
| 66 | acetic acid | 5 | DEPPO | 5 | ethanol | 0.2 | 1 | $9 \times 10^{10}$ | $4 \times 10^{11}$ | $6 \times 10^{10}$ |
| 67 | malonic acid | 5 | DEPPO | 0.1 | ethanol | 0.2 | 2 | $4 \times 10^{11}$ | $4 \times 10^{10}$ | $3 \times 10^{11}$ |
| 68 | fumaric acid | 5 | DEPPO | 0.1 | ethanol | 0.2 | 2 | $2 \times 10^{10}$ | $3 \times 10^{10}$ | $3 \times 10^{10}$ |
| 69 | malic acid | 5 | DEPPO | 0.1 | ethanol | 0.2 | 2 | $4 \times 10^{10}$ | $8 \times 10^{10}$ | $4 \times 10^{10}$ |
| 70 | tartaric acid | 5 | DEPPO | 0.1 | ethanol | 0.2 | 3 | $4 \times 10^{10}$ | $9 \times 10^{10}$ | $4 \times 10^{10}$ |
| 71 | citric acid | 20 | DEPPO | 5 | ethanol | 10 | 1 | $7 \times 10^{10}$ | $4 \times 10^{10}$ | $2 \times 10^{11}$ |
| 72 | citric acid | 5 | hexametaphosphoric acid | 0.1 | ethanol | 0.2 | 2 | $9 \times 10^{11}$ | $7 \times 10^{10}$ | $4 \times 10^{10}$ |
| 73 | citric acid | 5 | EDTPO | 0.1 | isopropylalcohol | 0.2 | 2 | $2 \times 10^{10}$ | $9 \times 10^{10}$ | $7 \times 10^{10}$ |
| 74 | citric acid | 5 | TTHA | 0.01 | isopropylalcohol | 0.2 | 2 | $3 \times 10^{11}$ | $3 \times 10^{11}$ | $5 \times 10^{11}$ |
| 75 | citric acid | 10 | TETHP | 0.1 | ethylene glycol | 5 | 2 | $5 \times 10^{11}$ | $4 \times 10^{10}$ | $4 \times 10^{10}$ |
| 76 | citric acid | 5 | NTPO | 0.1 | ethylene glycol | 0.2 | 2 | $4 \times 10^{10}$ | $6 \times 10^{10}$ | $3 \times 10^{11}$ |

Comparative Examples 83 to 95

The wafers contaminated with metals were treated in the similar way as in Examples 45 to 76 except for using various solutions described in Table 5. Thereafter, the same measurement and evaluation as in Examples 45 to 76 were carried out for the wafers contaminated with metals.

The results are shown in Tables 5.

TABLE 5

| Comp. Ex. | Organic acid | conc. (% by WT) | Complexing agent | conc. (% by WT) | Organic solvent | conc. (% by WT) | pH | remaining Fe conc. (Fe atom/cm$^2$) | remaining Al conc. (Al atom/cm$^2$) | remaining Cu conc. (Cu atom/cm$^2$) |
|---|---|---|---|---|---|---|---|---|---|---|
| 83 | — | | — | | — | | 7 | $1 \times 10^{13}$ | $9 \times 10^{12}$ | $7 \times 10^{12}$ |
| 84 | — | | HEDEPO | 0.1 | — | | 3 | $4 \times 10^{12}$ | $6 \times 10^{12}$ | $7 \times 10^{12}$ |
| 85 | citric acid | 20 | EDTPO | 5 | — | | 1 | $1 \times 10^{10}$ | $6 \times 10^{10}$ | $7 \times 10^{10}$ |
| 86 | citric acid | 5 | TTHA | 0.01 | — | | 2 | $1 \times 10^{10}$ | $5 \times 10^{11}$ | $5 \times 10^{11}$ |
| 87 | citric acid | 5 | DEPPO | 1 | — | | 2 | $4 \times 10^{10}$ | $9 \times 10^{10}$ | $8 \times 10^{11}$ |
| 88 | citric acid | 5 | EDTA | 0.01 | — | | 2 | $9 \times 10^{10}$ | $9 \times 10^{12}$ | $6 \times 10^{10}$ |
| 89 | citric acid | 5 | TETHP | 0.1 | — | | 2 | $7 \times 10^{11}$ | $8 \times 10^{11}$ | $8 \times 10^{10}$ |
| 90 | citric acid | 5 | NTPO | 0.1 | — | | 2 | $4 \times 10^{10}$ | $1 \times 10^{11}$ | $3 \times 10^{11}$ |
| 91 | citric acid | 5 | hexametaphosphoric acid | 0.1 | — | | 2 | $4 \times 10^{11}$ | $7 \times 10^{10}$ | $9 \times 10^{10}$ |
| 92 | citric acid | 5 | ammonium fluoride | 1 | — | | 2 | $5 \times 10^{11}$ | $1 \times 10^{11}$ | $3 \times 10^{11}$ |
| 93 | citric acid | 5 | ammonium fluoride | 0.1 | — | | 2 | $4 \times 10^{121}$ | $2 \times 10^{11}$ | $1 \times 10^{11}$ |
| 94 | citric acid | 5 | ammonium fluoride | 0.2 | — | | 2 | $4 \times 10^{10}$ | $9 \times 10^{10}$ | $9 \times 10^{10}$ |
| 95 | citric acid | 5 | ammonium fluoride | 0.2 | — | | 2 | $4 \times 10^{10}$ | $8 \times 10^{10}$ | $6 \times 10^{10}$ |

As apparent from the results of Table 4 and Table 5, it can be understood that use of the cleaning agent of the present invention can greatly reduce an amount of metal remaining on a surface of wafer and the capability thereof is equivalent or better than the cleaning agent conventionally used.

As apparent from the above, it can be understood that the cleaning agent according to the present invention can not only well remove a carbon defect remaining on a surface of substrate, but also effectively remove impurities derived from various kinds of metals (metallic impurities) at the same time.

Examples 77 to 108

The wafers contaminated with metals prepared by the above method were subjected to a brush scrub cleaning using a brush made of poly(vinyl alcohol), while each of the cleaning agents described in Table 6 was sprayed on a surface of said wafers. The treatment temperature was 25° C., and cleaning time was 1 min. After cleaning, the wafers were rinsed with ultra pure water for 10 min, and spin-dried.

For the wafers contaminated with metals thus treated, remaining metal concentrations (remaining Fe concentration, remaining Al concentration, and remaining Cu concentration) adsorbed and remaining on a surface of the wafer were measured, to evaluate capability of removing metallic impurities.

The results are shown in Table 6

TABLE 6

| Ex. | Organic acid | conc. (% by WT) | Complexing agent | conc. (% by WT) | Organic solvent | conc. (% by WT) | pH | remaining Fe conc. (Fe atom/cm$^2$) | remaining Al conc. (Al atom/cm$^2$) | remaining Cu conc. (Cu atom/cm$^2$) |
|---|---|---|---|---|---|---|---|---|---|---|
| 77 | citric acid | 5 | — | | methanol | 0.2 | 2 | $8 \times 10^{12}$ | $1 \times 10^{13}$ | $1 \times 10^{13}$ |
| 78 | acetic acid | 5 | — | | methanol | 0.2 | 2 | $7 \times 10^{12}$ | $6 \times 10^{12}$ | $7 \times 10^{12}$ |
| 79 | malonic acid | 5 | — | | isopropyl-alcohol | 5 | 3 | $5 \times 10^{12}$ | $1 \times 10^{13}$ | $8 \times 10^{12}$ |
| 80 | fumaric acid | 5 | — | | 2-methoxy-ethanol | 10 | 3 | $9 \times 10^{12}$ | $1 \times 10^{13}$ | $9 \times 10^{12}$ |
| 81 | malic acid | 5 | — | | ethylene glycol | 2 | 3 | $6 \times 10^{12}$ | $1 \times 10^{13}$ | $8 \times 10^{12}$ |
| 82 | tartaric acid | 5 | — | | diethylene glycol monomethyl ether | 5 | 3 | $8 \times 10^{12}$ | $7 \times 10^{12}$ | $5 \times 10^{12}$ |
| 83 | oxalic acid | 5 | — | | acetone | 0.2 | 2 | $9 \times 10^{12}$ | $5 \times 10^{12}$ | $8 \times 10^{12}$ |
| 84 | oxalic acid | 5 | — | | acetonitrile | 0.2 | 2 | $7 \times 10^{12}$ | $6 \times 10^{12}$ | $1 \times 10^{13}$ |
| 85 | — | | EDTA | 0.01 | methanol | 0.2 | 5 | $9 \times 10^{12}$ | $8 \times 10^{12}$ | $1 \times 10^{13}$ |
| 86 | — | | DEPPO | 0.1 | methanol | 0.2 | 3 | $1 \times 10^{12}$ | $6 \times 10^{11}$ | $7 \times 10^{11}$ |
| 87 | — | | EDTPO | 0.1 | isopropyl-alcohol | 0.2 | 2 | $5 \times 10^{11}$ | $1 \times 10^{12}$ | $9 \times 10^{11}$ |
| 88 | — | | CyDTA | 0.01 | 2-methoxy-ethanol | 0.2 | 5 | $5 \times 10^{12}$ | $1 \times 10^{13}$ | $6 \times 10^{12}$ |
| 89 | — | | HEDPO | 0.1 | 2-methoxy-ethanol | 0.2 | 3 | $5 \times 10^{11}$ | $1 \times 10^{12}$ | $3 \times 10^{11}$ |
| 90 | — | | HEDPO | 0.1 | ethylene glycol | 0.2 | 3 | $6 \times 10^{11}$ | $7 \times 10^{11}$ | $6 \times 10^{11}$ |
| 91 | — | | DETPPO | 5 | diethylene glycol monomethyl ether | 0.2 | 2 | $5 \times 10^{11}$ | $1 \times 10^{12}$ | $5 \times 10^{11}$ |
| 92 | — | | DETPPO | 0.1 | diethylene glycol monomethyl ether | 0.2 | 3 | $8 \times 10^{11}$ | $1 \times 10^{12}$ | $8 \times 10^{11}$ |
| 93 | — | | HEDPO | 0.1 | acetone | 5 | 3 | $9 \times 10^{11}$ | $6 \times 10^{11}$ | $9 \times 10^{11}$ |
| 94 | — | | PTDMP | 0.1 | acetone | 0.2 | 3 | $5 \times 10^{11}$ | $1 \times 10^{12}$ | $5 \times 10^{11}$ |
| 95 | — | | EDTA | 0.1 | acetonitrile | 5 | 5 | $8 \times 10^{12}$ | $1 \times 10^{13}$ | $8 \times 10^{12}$ |
| 96 | — | | EDDPO | 0.1 | acetonitrile | 0.2 | 3 | $5 \times 10^{11}$ | $7 \times 10^{11}$ | $8 \times 10^{11}$ |
| 97 | citric acid | 10 | EDTA | 0.01 | methanol | 0.2 | 2 | $5 \times 10^{11}$ | $2 \times 10^{11}$ | $1 \times 10^{11}$ |
| 98 | acetic acid | 5 | DEPPO | 5 | ethanol | 0.2 | 2 | $5 \times 10^{11}$ | $1 \times 10^{10}$ | $1 \times 10^{10}$ |
| 99 | malonic acid | 5 | DEPPO | 0.1 | ethanol | 0.2 | 3 | $5 \times 10^{11}$ | $1 \times 10^{10}$ | $1 \times 10^{10}$ |
| 100 | fumaric acid | 5 | DEPPO | 0.1 | ethanol | 0.2 | 3 | $5 \times 10^{11}$ | $1 \times 10^{10}$ | $1 \times 10^{10}$ |
| 101 | malic acid | 5 | DEPPO | 0.1 | ethanol | 0.2 | 3 | $5 \times 10^{11}$ | $1 \times 10^{10}$ | $3 \times 10^{10}$ |
| 102 | tartaric acid | 5 | DEPPO | 0.1 | ethanol | 0.2 | 3 | $5 \times 10^{11}$ | $1 \times 10^{10}$ | $3 \times 10^{10}$ |
| 103 | citric acid | 20 | DEPPO | 5 | ethanol | 10 | 1 | $4 \times 10^{10}$ | $9 \times 10^{10}$ | $8 \times 10^{11}$ |
| 104 | citric acid | 5 | hexameta-phosphoric acid | 0.1 | ethanol | 0.2 | 2 | $4 \times 10^{13}$ | $7 \times 10^{10}$ | $9 \times 10^{11}$ |

TABLE 6-continued

| Ex. | Organic acid | conc. (% by WT) | Complexing agent | conc. (% by WT) | Organic solvent | conc. (% by WT) | pH | remaining Fe conc. (Fe atom/cm$^2$) | remaining Al conc. (Al atom/cm$^2$) | remaining Cu conc. (Cu atom/cm$^2$) |
|---|---|---|---|---|---|---|---|---|---|---|
| 105 | citric acid | 5 | EDTPO | 0.1 | isopropyl-alcohol | 0.2 | 2 | $1 \times 10^{10}$ | $4 \times 10^{10}$ | $2 \times 10^{10}$ |
| 106 | citric acid | 5 | TTHA | 0.01 | isopropyl-alcohol | 0.2 | 2 | $1 \times 10^{10}$ | $5 \times 10^{11}$ | $3 \times 10^{11}$ |
| 107 | citric acid | 5 | TETHP | 0.1 | ethylene glycol | 5 | 2 | $7 \times 10^{11}$ | $8 \times 10^{10}$ | $2 \times 10^{10}$ |
| 108 | citric acid | 5 | NTPO | 0.1 | ethylene glycol | 0.2 | 2 | $4 \times 10^{10}$ | $1 \times 10^{11}$ | $3 \times 10^{11}$ |

Comparative Examples 96 to 108

The wafers contaminated with metals were treated in the similar way as in Examples 77 to 108 except for using various solutions described in Table 7. Thereafter, the same measurement and evaluation as in Examples 77 to 108 were carried out for the wafers contaminated with metals.

The results are shown in Tables 7.

TABLE 7

| Comp. Ex. | Organic acid | conc. (% by WT) | Complexing agent | conc. (% by WT) | Organic solvent | conc. (% by WT) | pH | remaining Fe conc. (Fe atom/cm$^2$) | remaining Al conc. (Al atom/cm$^2$) | remaining Cu conc. (Cu atom/cm$^2$) |
|---|---|---|---|---|---|---|---|---|---|---|
| 96 | — | | — | | — | | 7 | $8 \times 10^{12}$ | $8 \times 10^{12}$ | $1 \times 10^{13}$ |
| 97 | — | | HEDEPO | 0.1 | — | | 3 | $5 \times 10^{12}$ | $1 \times 10^{13}$ | $6 \times 10^{11}$ |
| 98 | citric acid | 20 | EDTPO | 5 | — | | 1 | $9 \times 10^{12}$ | $3 \times 10^{12}$ | $1 \times 10^{13}$ |
| 99 | citric acid | 5 | TTHA | 0.01 | — | | 2 | $7 \times 10^{12}$ | $5 \times 10^{12}$ | $6 \times 10^{12}$ |
| 100 | citric acid | 5 | DEPPO | 1 | — | | 2 | $9 \times 10^{12}$ | $9 \times 10^{12}$ | $7 \times 10^{12}$ |
| 101 | citric acid | 5 | EDTA | 0.01 | — | | 2 | $1 \times 10^{13}$ | $2 \times 10^{12}$ | $5 \times 10^{12}$ |
| 102 | citric acid | 5 | TETHP | 0.1 | — | | 2 | $5 \times 10^{11}$ | $8 \times 10^{12}$ | $6 \times 10^{12}$ |
| 103 | citric acid | 5 | NTPO | 0.1 | — | | 2 | $6 \times 10^{12}$ | $1 \times 10^{12}$ | $1 \times 10^{13}$ |
| 104 | citric acid | 5 | hexameta-phosphoric acid | 0.1 | — | | 2 | $8 \times 10^{12}$ | $7 \times 10^{12}$ | $2 \times 10^{13}$ |
| 105 | citric acid | 5 | ammonium fluoride | 1 | — | | 2 | $5 \times 10^{11}$ | $1 \times 10^{13}$ | $3 \times 10^{12}$ |
| 106 | citric acid | 5 | ammonium fluoride | 0.1 | — | | 2 | $6 \times 10^{11}$ | $2 \times 10^{12}$ | $1 \times 10^{10}$ |
| 107 | citric acid | 5 | ammonium fluoride | 0.2 | — | | 2 | $4 \times 10^{10}$ | $9 \times 10^{12}$ | $6 \times 10^{10}$ |
| 108 | citric acid | 5 | ammonium fluoride | 0.2 | — | | 2 | $3 \times 10^{10}$ | $4 \times 10^{12}$ | $4 \times 10^{10}$ |

As apparent from the results of Table 6 and Table 7, it can be understood that amount of metals remaining on a surface of wafer can be remarkably reduced when a physical cleaning was conducted using the cleaning agent of the present invention.

Examples 109 to 140

The wafer contaminated with particles prepared by the above-described method was dipped in 1 L each of cleaning agents described in Table 8, at room temperature for 5 hours. Thereafter, said wafer was taken out, rinsed with ultra pure water for 10 mins, and spin-dried.

For the wafers contaminated with particles thus treated, number of particles adsorbed and remaining on a surface of the wafer were measured, to evaluate capability of removing particles.

The results are shown in Table 8.

TABLE 8

| Ex. | Organic acid | conc. (% by WT) | Complexing agent | conc. (% by WT) | Organic solvent | conc. (% by WT) | pH | number of particle (particle/wafer) |
|---|---|---|---|---|---|---|---|---|
| 109 | citric acid | 5 | — | | methanol | 0.2 | 2 | 500 |
| 110 | acetic acid | 5 | — | | methanol | 0.2 | 2 | 200 |
| 111 | malonic acid | 5 | — | | isopropylalcohol | 0.2 | 2 | 300 |
| 112 | fumaric acid | 5 | — | | 2-methoxyethanol | 0.2 | 2 | 400 |
| 113 | malic acid | 5 | — | | ethylene glycol | 0.2 | 2 | 300 |
| 114 | tartaric acid | 5 | — | | diethylene glycol monomethyl ether | 0.2 | 2 | 400 |
| 115 | oxalic acid | 5 | — | | acetone | 0.2 | 2 | 500 |
| 116 | oxalic acid | 5 | — | | acetonitrile | 0.2 | 2 | 300 |
| 117 | — | | EDTA | 0.01 | methanol | 0.2 | 5 | 200 |
| 118 | — | | DEPPO | 0.1 | methanol | 0.2 | 3 | 300 |
| 119 | — | | EDTPO | 0.1 | isopropylalcohol | 0.2 | 3 | 200 |
| 120 | — | | CyDTA | 0.01 | 2-methoxyethanol | 0.2 | 5 | 300 |
| 121 | — | | HEDPO | 0.1 | 2-methoxyethanol | 5 | 2 | 300 |
| 122 | — | | HEDPO | 0.1 | ethylene glycol | 5 | 3 | 400 |
| 123 | — | | DETPPO | 5 | diethylene glycol monomethyl ether | 0.2 | 2 | 200 |
| 124 | — | | DETPPO | 0.1 | diethylene glycol monomethyl ether | 0.2 | 3 | 300 |
| 125 | — | | HEDPO | 0.1 | acetone | 0.2 | 3 | 200 |
| 126 | — | | PTDMP | 0.1 | acetone | 1 | 2 | 100 |
| 127 | — | | EDTA | 0.01 | acetonitrile | 0.2 | 5 | 400 |
| 128 | — | | EDDPO | 0.1 | acetonitrile | 1 | 2 | 300 |
| 129 | citric acid | 20 | EDTA | 0.01 | methanol | 0.2 | 1 | 300 |
| 130 | acetic acid | 5 | DEPPO | 5 | ethanol | 0.2 | 2 | 300 |
| 131 | malonic acid | 5 | DEPPO | 0.1 | methanol | 0.2 | 2 | 400 |
| 132 | fumaric acid | 5 | DEPPO | 0.1 | ethanol | 0.2 | 2 | 500 |
| 133 | malic acid | 5 | DEPPO | 0.1 | ethanol | 0.2 | 2 | 300 |
| 134 | tartaric acid | 5 | DEPPO | 5 | ethanol | 0.2 | 2 | 300 |
| 135 | citric acid | 20 | DEPPO | 5 | ethanol | 0.2 | 1 | 500 |
| 136 | citric acid | 10 | hexametaphosphoric acid | 0.1 | ethanol | 0.2 | 2 | 500 |
| 137 | citric acid | 5 | EDTPO | 0.1 | isopropylalcohol | 0.2 | 2 | 300 |
| 138 | citric acid | 5 | TTHA | 0.01 | isopropylalcohol | 0.2 | 2 | 500 |
| 139 | citric acid | 5 | TETHP | 0.1 | ethylene glycol | 0.2 | 2 | 400 |
| 140 | citric acid | 5 | NTPO | 0.1 | ethylene glycol | 0.2 | 2 | 300 |

Comparative Examples 109 to 121

The wafers contaminated with particles were treated in the similar way as in Examples 109 to 140 except for using various solutions described in Table 9. Thereafter, the same measurement and evaluation as in Examples 109 to 140 were carried out for the wafers contaminated with particles.

The results are shown in Tables 9.

TABLE 9

| Comp. Ex. | Organic acid | conc. (% by WT) | Complexing agent | conc. (% by WT) | Organic solvent | conc. (% by WT) | pH | number of particle (particle/wafer) |
|---|---|---|---|---|---|---|---|---|
| 109 | — | | — | | — | | 7 | 6000 |
| 110 | — | | HEDPO | 5 | — | | 2 | 200 |
| 111 | citric acid | 10 | EDTPO | 5 | — | | 2 | 500 |
| 112 | citric acid | 5 | TTHA | 0.01 | — | | 2 | 600 |
| 113 | citric acid | 5 | DEPPO | 1 | — | | 2 | 500 |
| 114 | citric acid | 5 | EDTA | 0.01 | — | | 2 | 300 |
| 115 | citric acid | 5 | TETHP | 0.1 | — | | 2 | 400 |
| 116 | citric acid | 5 | NTPO | 0.1 | — | | 2 | 600 |
| 117 | citric acid | 5 | hexametaphosphoric acid | 0.1 | — | | 2 | 400 |
| 118 | citric acid | 10 | ammonium fluoride | 1 | — | | 2 | 300 |
| 119 | citric acid | 5 | ammonium fluoride | 0.1 | — | | 2 | 300 |
| 120 | citric acid | 5 | ammonium fluoride | 0.2 | — | | 2 | 500 |
| 121 | citric acid | 5 | ammonium fluoride | 0.2 | — | | 2 | 500 |

As apparent from the results of Table 8 and Table 9, it can be understood that use of the cleaning agent of the present invention can remove particles on a surface of wafer and the capability thereof is equivalent or better than the cleaning agent conventionally used.

As apparent from the above, it can be understood that the cleaning agent according to the present invention can not only well remove a carbon defect remaining on a surface of substrate, but also effectively remove fine particles (particles) present on a surface of substrate as well as impurities derived from various kinds of metals (metallic impurities) at the same time.

What is claimed is:

1. A cleaning method for a surface of a semiconductor substrate, which comprises the steps of:
    chemical mechanical polishing the surface of the semiconductor substrate on which copper wiring is provided with a slurry containing benzotriazole or a derivative thereof,
    treating the surface of the semiconductor substrate with a cleaning agent after the polishing step,
    wherein the cleaning agent consists essentially of [I] an organic acid having at least one carboxyl group, [II] a complexing agent having at least one phosphonic acid group in a molecule selected from the group consisting of (1)nitrogen-containing polyphosphonic acids having 1 to 6 nitrogen atoms and 1 to 8 phosphonic acid groups in a molecule, (2) aryl polyphosphonic acids, (3) alkylene polyphosphonic acids, (4) alkane polyphosphonic acids which may have a hydroxyl group, and (5) ammonium salt or an alkali metal salt thereof, [III] at least one organic solvent selected from the group consisting of (1) monohydric alcohols, (2) alkoxyalcohols, (3) glycols, (4) glycol ethers, (5) ketones and (6) nitriles, and [IV] water;
    wherein the cleaning agent does not contain hydrochloric acid, nitric acid, sulfuric acid, phosphoric acid and hydrofluoric acid; and
    wherein the total concentration of the organic solvent(s) in the cleaning agent is 0.05 to 40% by weight; and pH of the cleaning agent is 0.5 to 6.5.

2. The cleaning method according to claim 1, wherein the treatment with the cleaning agent is dipping the surface of the semiconductor substrate in the cleaning agent or spraying the cleaning agent on the surface of the semiconductor substrate.

3. The cleaning method according to claim 1, wherein physical cleaning is further used in combination with the cleaning agent.

4. The cleaning method according to claim 1, wherein the nitrogen-containing polyphosphonic acids having 1 to 6 nitrogen atoms and 1 to 8 phosphonic acid groups in a molecule is one selected from the group consisting of an alkylamino poly(alkylphosphonic acid), a mono- or polyalkylenepolyamine poly(alkylphosphonic acid), a nitrilo-poly(alkylphosphonic acid), and an ammonium salt or an alkali metal salt thereof.

5. The cleaning method according to claim 1, wherein the complexing agent is one selected from the group consisting of:
    ethylenediaminebis(methylenephosphonic acid) [EDDPO];
    ethylenediaminetetrakis(ethylenephosphonic acid);
    ethylenediaminetetrakis(methylenephosphonic acid) [EDTPO];
    hexamethylenediaminetetrakis(methylenephosphonic acid);
    isopropylenediaminebis(methylenephosphonic acid);
    isopropylenediamintetra(methylenephosphonic acid);

propanediaminetetra(ethylenephosphonic acid) [PDTMP];
diaminopropanetetra(methylenephosphonic acid) [PDTPO];
diethylenetriaminepenta(ethylenephosphonic acid) [DEPPO];
diethylenetriaminepenta(methylenephosphonic acid) [DETPPO];
triethylenetetraminehexa(ethylenephosphonic acid) [TETHP];
triethylenetetraminehexa(methylenephosphonic acid) [TTHPO];
nitrilotris(methylenephosphonic acid) [NTPO];
ethylidenediphosphonic acid;
1-hydroxyethylidene-1,1'-diphosphonic acid [HEDPO];
1-hydroxypropylidene-1,1'-diphosphonic acid; and
1-hydroxybutylidene-1,1'-diphosphonic acid.

6. The cleaning method according to claim 1, wherein the organic solvent is one selected from the group consisting of methanol, ethanol, isopropyl alcohol, 2-methoxyetanol, 2-(2-butoxyethoxy)ethanol, ethylene glycol, diethylene glycol, diethylene glycol monomethyl ether, acetone and acetonitrile.

7. The cleaning method according to claim 1, wherein the total concentration of the organic acid(s) in the cleaning agent is 10 to 40% by weight, the total concentration of the complexing agent(s) in the cleaning agent is 5 to 30% by weight and the total concentration of the organic solvent(s) in the cleaning agent is 10 to 40% by weight.

\* \* \* \* \*